(12) United States Patent
Zhang et al.

(10) Patent No.: US 11,468,634 B2
(45) Date of Patent: Oct. 11, 2022

(54) MACHINE LEARNING TECHNIQUES FOR GENERATING DESIGNS FOR THREE-DIMENSIONAL OBJECTS

(71) Applicant: AUTODESK, INC., San Rafael, CA (US)

(72) Inventors: Ran Zhang, San Jose, CA (US); Morgan Fabian, San Francisco, CA (US); Ebot Ndip-Agbor, San Rafael, CA (US); Lee Morris Taylor, Cedar Crest, NM (US)

(73) Assignee: AUTODESK, INC., San Francisco, CA (US)

( * ) Notice: Subject to any disclaimer, the term of this patent is extended or adjusted under 35 U.S.C. 154(b) by 0 days.

(21) Appl. No.: 17/083,147

(22) Filed: Oct. 28, 2020

(65) Prior Publication Data
US 2022/0130110 A1    Apr. 28, 2022

(51) Int. Cl.
*G06T 17/20* (2006.01)
*G06N 20/00* (2019.01)
*G06N 3/08* (2006.01)

(52) U.S. Cl.
CPC ............. *G06T 17/20* (2013.01); *G06N 3/08* (2013.01); *G06N 20/00* (2019.01)

(58) Field of Classification Search
CPC .......... G06T 17/20; G06T 19/20; G06T 3/40; G06T 17/205; G06T 2219/2021;
(Continued)

(56) References Cited

U.S. PATENT DOCUMENTS

| 2016/0004793 A1 | 1/2016 | Saito |
| 2018/0018766 A1 | 1/2018 | Jang et al. |

(Continued)

FOREIGN PATENT DOCUMENTS

| CN | 109063291 A | 12/2018 |
| WO | 2020/014490 A1 | 1/2020 |
| WO | 2020/160099 A1 | 8/2020 |

OTHER PUBLICATIONS

H. Chi, Y. Zhang, T. L. E. Tang, L. Mirabella, L. Dalloro, L. Song, and G. H. Paulino. "Universal Machine Learning for Topology Optimization." Computer Methods in Applied Mechanics and Engineering, https://www.researchgate.net/publication/348096256_Universal_machine_learning_for_topology_optimization, 4 pages.

(Continued)

*Primary Examiner* — Xilin Guo
(74) *Attorney, Agent, or Firm* — Artegis Law Group, LLP

(57) ABSTRACT

In various embodiments, a topology optimization application solves a topology optimization problem associated with designing a three-dimensional ("3D") object. The topology optimization application coverts a first shape having a first resolution and representing the 3D object to a coarse shape having a second resolution that is lower than the first resolution. Subsequently, the topology optimization application computes coarse structural analysis data based on the coarse shape. The topology optimization application then uses a trained machine learning model to generate a second shape having the first resolution and representing the 3D object based on the first shape and the coarse structural analysis data. The trained machine learning model modifies a portion of a shape having the first resolution based on structural analysis data having the second resolution. Advantageously, generating the second shape based on structural (Continued)

analysis data having a lower resolution reduces computational complexity relative to prior art techniques.

20 Claims, 6 Drawing Sheets

(58) Field of Classification Search
CPC ............ G06T 2207/30244; G06T 7/60; G06T 15/005; G06T 17/00; G06T 9/001; G06T 15/08; G06N 20/00; G06N 3/08; G06N 3/04; G03F 7/0037; H04N 13/239; H04N 13/25; H04N 13/275
See application file for complete search history.

(56) References Cited

U.S. PATENT DOCUMENTS

| | | | |
|---|---|---|---|
| 2018/0046926 A1 | 2/2018 | Achin et al. | |
| 2018/0060744 A1 | 3/2018 | Achin et al. | |
| 2018/0275637 A1 | 9/2018 | Elber et al. | |
| 2019/0159737 A1 | 5/2019 | Buckler et al. | |
| 2020/0005452 A1* | 1/2020 | Schroecker | G06T 5/002 |
| 2020/0035036 A1 | 1/2020 | Hirabayashi | |
| 2020/0134918 A1 | 4/2020 | Wang | |
| 2020/0184313 A1 | 6/2020 | Vogels et al. | |
| 2020/0210814 A1* | 7/2020 | Mehr | G06N 3/08 |
| 2020/0258223 A1 | 8/2020 | Yip et al. | |
| 2020/0302224 A1 | 9/2020 | Jaganathan et al. | |
| 2020/0379436 A1* | 12/2020 | Riss | G06T 19/00 |
| 2020/0387704 A1 | 12/2020 | Ng et al. | |
| 2021/0035352 A1* | 2/2021 | Harviainen | G02B 27/0172 |
| 2021/0357555 A1 | 11/2021 | Liu | |
| 2021/0390396 A1 | 12/2021 | Fan | |

OTHER PUBLICATIONS

Non-Final Office Action received for U.S. Appl. No. 17/083,153, dated Jun. 9, 2021, 17 pages.
Final Office Action received for U.S. Appl. No. 17/083,153, dated Oct. 7, 2021, 22 pages.
Advisory Action received for U.S. Appl. No. 17/083,153 dated Dec. 24, 2021, 4 pages.
Non Final Office Action received for U.S. Appl. No. 17/083,153 dated Jan. 19, 2022, 19 pages.
Extended European Search Report for Application No. 21203036.5 dated Apr. 5, 2022, 10 pages.
Extended European Search Report for Application No. 21203037.3 dated Apr. 19, 2022, 11 pages.
Banga et al., "3D Topology Optimization using Convolutional Neural Networks", Cornell University Library, 201 Olin Library Cornell University, Aug. 22, 2018, 21 pages.
Keshavarzzadeh et al., "Image-Based Multiresolution Topology Optimization Using Deep Disjunctive Normal Shape Model", DOI 10.1016/J.CAD.2020.102947, Computer-Aided Design, vol. 130, Sep. 28, 2020, 27 pages.
Final Office Action received for U.S. Appl. No. 17/083,153 dated May 27, 2022, 28 pages.
Advisory Action received for U.S. Appl. No. 17/083,153, dated Aug. 12, 2022, 14 pages.

* cited by examiner

MACHINE LEARNING TECHNIQUES FOR GENERATING DESIGNS FOR THREE-DIMENSIONAL OBJECTS

BACKGROUND

Field of the Various Embodiments

The various embodiments relate generally to computer science and computer-aided design and, more specifically, to machine learning techniques for generating designs for three-dimensional objects.

Description Of The Related Art

Generative design for three-dimensional ("3D") objects is a computer-aided design process that automatically generates designs for 3D objects that satisfy any number and type of design objectives and design constraints specified by a user. In some implementations, a generative design application specifies any number of topology optimization problems based on the design objectives and design constraints. Each problem specification includes a shape boundary and values for any number of parameters associated with the topology optimization problem. Some examples of parameters include, without limitation, material types, manufacturing methods, manufacturing constraints, load use cases, design constraints, design objectives, and completion criteria. The generative design application then configures a topology optimization application to independently solve each of the topology optimization problems. To solve a given topology optimization problem, a typical topology optimization application generates a shape based on the shape boundary and then iteratively optimizes the shape based on the values for the different parameters. The generative design application presents the resulting optimized shapes to the user as designs in a design space. Finally, the user explores the "generative" design space to select one or more of the designs included in the design space for additional design and/or manufacturing activities.

In one approach to solving a given topology optimization problem, the topology optimization application converts the shape boundary into a shape that is represented as mesh of shape elements corresponding to a 3D grid. The 3D grid defines the resolution at which the shape is to be optimized. During each iteration, the topology optimization application performs a structural analysis on the shape to compute the responses of each of the shape elements to each of the load use cases. Some examples of responses include, without limitation, strain energy values, displacements, and rotations. Based on the responses, the design constraints, and the design objectives, the topology optimization application executes any number of optimization algorithms that modify any number of the shape elements. For example, the topology optimization application could remove material from a subset of shape elements associated with the lowest strain energy values in order to reduce the overall mass of the corresponding shape. The topology optimization application continues to iteratively analyze and modify the shape in this fashion until the topology optimization application determines that one or more completion criteria are reached. The topology optimization application then outputs the shape generated during the final iteration as an optimized shape.

One drawback of the above approach is that solving each of the topology optimization problems involves executing computationally complex structural analysis operations for each of the shape elements during each of the topology optimization iterations. Accordingly, if the amounts of time and/or computational resources allocated for design activities are limited, a user may be forced to limit the total number of structural analysis operations performed during the different topology optimization iterations in order to reduce overall computational complexity. For example, the user could limit the total number of iterations that the topology optimization application executes to solve each of the topology optimization problems and/or limit the total number of topology optimization problems that the generative design application defines. By reducing the total number of structural analysis operations performed during the different topology optimization iterations, the user necessarily reduces the design space explored by the generative design application. As a result, the generative design application may fail to produce numerous designs that are more convergent with the design objectives than the designs generated by the generative design application based on the reduced number of structural analysis operations. In such situations, sub-optimal designs may be selected for additional design and/or manufacturing activities.

As the foregoing illustrates, what is needed in the art are more effective techniques for solving topology optimization problems when designing three-dimensional objects.

SUMMARY

One embodiment of the present invention sets forth a computer-implemented method for solving a topology optimization problem when designing a 3D object. The method includes converting a first shape having a first resolution and representing the 3D object to a coarse shape having a second resolution that is lower than the first resolution; computing coarse structural analysis data based on the coarse shape; and generating, via a trained machine learning model, a second shape having the first resolution and representing the 3D object based on the first shape and the coarse structural analysis data, where the trained machine learning model modifies a portion of a shape having the first resolution based on structural analysis data having the second resolution.

At least one technical advantage of the disclosed techniques relative to the prior art is that, with the disclosed techniques, the computational complexity associated with solving topology optimization problems when generating designs for 3D objects can be substantially reduced. In particular, the trained machine learning model modifies portions of a shape associated with one resolution based on corresponding structural analysis data associated with a lower resolution, thereby reducing the overall computational complexity associated with solving the corresponding topology optimization problem. When the computational complexity associated with solving the topology optimization problem is reduced, a generative design application can more comprehensively explore the overall design space relative to prior art approaches. As a result, the generative design application can produce designs that are more convergent with the design objectives, thereby enabling a more optimized design to be selected for additional design and/or manufacturing activities. These technical advantages provide one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

System Overview

Figure 1:
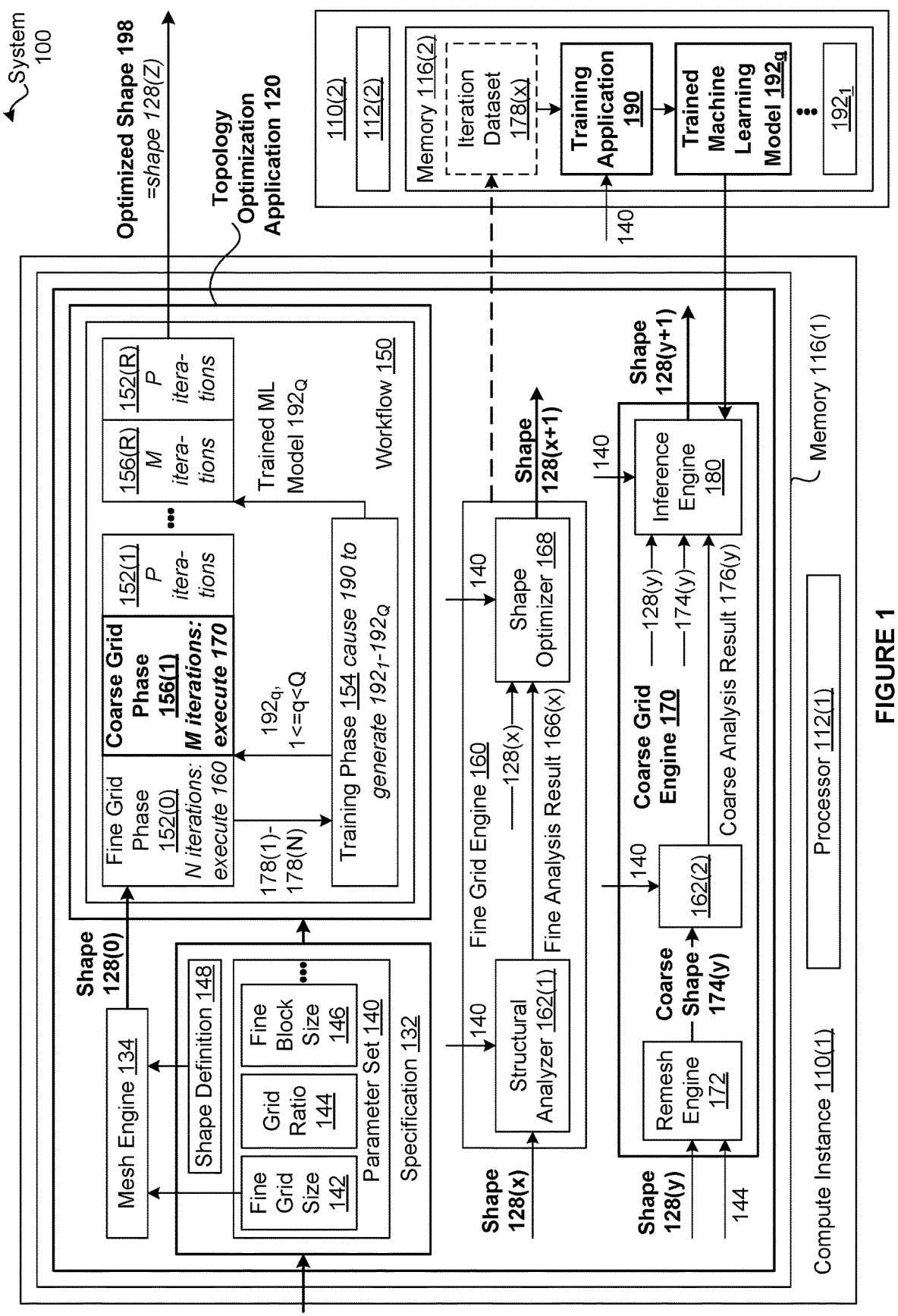
FIG. 1 is a conceptual illustration of a system configured to implement one or more aspects of the various embodiments.

FIG. 1 is a conceptual illustration of a system 100 configured to implement one or more aspects of the various embodiments. As shown, the system 100 includes, without limitation, a compute instance 110(1) and a compute instance 110(2). For explanatory purposes, multiple instances of like objects are denoted with reference numbers identifying the object and parenthetical alphanumeric character(s) identifying the instance where needed. Multiple versions of a single object, where each version is associated with a different point in time, are denoted with reference numbers identifying the object and alphanumeric subscript(s) identifying the version where needed.

Any number of the components of the system 100 can be distributed across multiple geographic locations or implemented in one or more cloud computing environments (i.e., encapsulated shared resources, software, data, etc.) in any combination. For explanatory purposes only, the compute instance 110(1) and the compute instance 110(2) are also referred to herein individually as "the compute instance 110" and collectively as "the compute instances 110." In some embodiments, the system 100 can include any number of compute instances 110. In the same or other embodiments, each of the compute instances 110 can be implemented in a cloud computing environment, implemented as part of any other distributed computing environment, or implemented in a stand-alone fashion.

As shown, the compute instance 110(1) includes, without limitation, a processor 112(1) and a memory 116(1), and the compute instance 110(2) includes, without limitation, a processor 112(2) and a memory 116(2). The processors 112(1) and 112(2) are also referred to herein individually as "the processor 112" and collectively as "the processors 112."

The memories 116(1) and 116(2) are also referred to herein individually as "the memory 116" and collectively as "the memories 116."

Each of the processors 112 can be any instruction execution system, apparatus, or device capable of executing instructions. For example, each of the processors 112 could comprise a central processing unit, a graphics processing unit, a controller, a micro-controller, a state machine, or any combination thereof. The memory 116 of each of the compute instances 110 stores content, such as software applications and data, for use by the processor 112 of the compute instance 110. In some alternate embodiments, each of any number of compute instances 110 can include any number of processors 112 and any number of memories 116 in any combination. In particular, any number of the compute instances 110 (including one) can provide a multiprocessing environment in any technically feasible fashion.

The memory 116 can be one or more of a readily available memory, such as random-access memory, read only memory, floppy disk, hard disk, or any other form of digital storage, local or remote. In some embodiments, a storage (not shown) can supplement or replace the memory 116. The storage can include any number and type of external memories that are accessible to the processor 112. For example, and without limitation, the storage can include a Secure Digital Card, an external Flash memory, a portable compact disc read-only memory, an optical storage device, a magnetic storage device, or any suitable combination of the foregoing.

In general, each of the compute instances 110 is configured to implement one or more software applications. For explanatory purposes only, each software application is described as residing in the memory 116 of one of the compute instances 110 and executing on a processor 112 of the compute instance 110. However, in some embodiments, the functionality of any number of software applications can be distributed across any number of other software applications that reside in the memories 116 of any number of compute instances 110 and execute on the processors 112 of any number of compute instances 110 in any combination. Further, the functionality of any number of software applications can be consolidated into a single software application.

In particular, the compute instance 110(1) is configured to solve a topology optimization problem that is defined via a specification 132. The specification 132 includes, without limitation, any amount and/or types of data associated with the topology optimization problem. As shown, the specification 132 includes, without limitation, a parameter set 140 and a shape definition 148.

The parameter set 140 specifies values for any number and/or types of parameters associated with the topology optimization problem. Some examples of parameters include, without limitation, a material, a manufacturing method, manufacturing constraints, load uses cases, design constraints, design objectives, a completion criterion, etc. For explanatory purposes only, the values for parameters that are specified in the parameter set 140 are also referred to herein as individually as "the parameter value" and collectively as "the parameter values."

The shape definition 148 characterizes any number and/or types of aspects of an initial shape of a 3D object associated with the topology optimization problem in any technically feasible fashion. In some embodiments, the shape definition 148 specifies, without limitation, a shape boundary that specifies a maximum volume associated with the 3D object. For instance, in some embodiments, the shape definition 148 specifies a 3D cube that defines a maximum volume. In some embodiments, the shape definition 148 specifies an initial shape of the 3D object. In the same or other embodiments, the shape definition 148 specifies, without limitation, any number and/or types of "keep-ins," where each keep-in specifies a portion of the initial shape (e.g., a mounting plate) that is to be preserved. The keep-ins can be specified in any technically feasible fashion (e.g., via keep-in labels).

As described previously herein, in one approach to designing a 3D object, a generative design application specifies any number of topology optimization problems based on design objectives and design constraints specified by a user. The generative design application then configures a topology optimization application to independently solve each of the topology optimization problems. To solve a given topology optimization problem, the topology optimization application iteratively optimizes an initial shape to generate an optimized shape that is more convergent with the design objectives than the initial shape.

In one approach to solving a given topology optimization problem, a conventional topology application represents the initial shape as a mesh of shape elements corresponding to a 3D grid having a given resolution. During each iteration, the conventional topology application performs a structural analysis to compute the responses of each of the shape elements to any number of load use cases. The conventional topology application then optimizes any number of the shape elements based on the responses, the design constraints, and the design objectives.

One drawback of the above approach is that solving each of the topology optimization problems involves executing computationally complex structural analysis operations for each of the shape elements during each of the iterations. If the amounts of time and/or computational resources allocated for design activities are limited, a user may be forced to limit the total number of structural analysis operations performed during the different topology optimization iterations in order to reduce overall computational complexity. By reducing the total number of structural analysis operations performed during the different topology optimization iterations, the user necessarily reduces the number and/or quality of optimized designs generated by the generative design application. In such situations, sub-optimal designs may be selected for additional design and/or manufacturing activities Using Machine Learning Techniques to Reduce Computational Complexity To address the above problems, in some embodiments, the compute instance 110(1) includes, without limitation, a topology optimization application 120. The topology optimization application 120 selectively uses one or more versions of a trained machine learning model 192 (not explicitly shown in FIG. 1) to reduce the overall computational complexity when solving the topology optimization problem that is defined via the specification 132. In some embodiments, the compute instance 110(2) includes, without limitation, a training application 190 that performs any number and/or types of machine learning operations to generate any number of versions of the trained machine learning model 192.

For explanatory purposes only, the different versions of the trained machine learning model 192 are denoted herein as the trained machine learning models $192_1$-$192_Q$, where Q can be any positive integer. Each of the trained machine learning models $192_1$-$192_Q$ corresponds to a different point in time. The trained machine learning models $192_1$-$192_Q$ are also referred to herein individually as "the trained machine learning model 192" and collectively as "the trained machine learning models 192."

As shown, in some embodiments, the topology optimization application 120 resides in the memory 116(1) of the compute instance 110(1) and executes on the processor 112(1) of the compute instance 110(1). In the same or other embodiments, the training application 190 resides in the memory 116(2) of the compute instance 110(2) and executes on the processor 112(2) of the compute instance 110(2). More generally, in some embodiments, the functionality of the topology optimization application 120 and/or the functionality of the training application 190 are distributed across any number of software applications. Each software application can reside in any number of the memories 116 of any number of the compute instances 110 and execute on any number of the processors 112 of any number of the compute instances 110 in any combination. In some other embodiments, the functionality of the topology optimization application 120 and the functionality of the training application 190 are consolidated into a single software application.

In some embodiments, the topology optimization application 120 generates an optimized shape 198 based on the specification 132. As described previously herein, the specification 132 includes, without limitation, any amount and/or types of data associated with a topology optimization problem. The topology optimization application 120 can acquire the specification 132 in any technically feasible fashion. In some embodiments, the topology optimization application 120 receives the specification 132 from a generative design application (not shown) that executes a generative design process. As described previously here, in some embodiments, the specification 132 includes, without limitation, the parameter set 140 and the shape definition 148.

The parameter set 140 specifies, without limitation, any number of parameter values for any number and/or types of parameters associated with the topology optimization problem. As shown, in some embodiments, the parameter set 140 includes, without limitation, a fine grid size 142, a grid ratio 144, a fine block size 146, and any number and/or types of other parameter values (indicated via an ellipsis) that are organized in any technically feasible fashion. For instance, in some embodiments, the specification 132 includes, without limitation, any number and/or types of parameter values associated with manufacturing, load use cases, design constraints, design objectives, solving topology optimization problems (e.g., a completion criterion), and generating the trained machine learning model 192, in any combination.

The fine grid size 142 specifies, without limitation, the 3D dimensions of a fine grid (not shown in FIG. 1). In some embodiments, the fine grid defines a 3D mesh of voxels, where each voxel corresponds to a different portion of 3D space. The fine grid determines, at least in part, the resolution of the initial shape associated with the topology optimization. The grid ratio 144 specifies a ratio between the fine grid and a coarse grid (not shown in FIG. 1) that is a downsampled version of the fine grid. The grid ratio can specify any ratio in any technically feasible fashion.

For instance, in some embodiments, the fine grid size 142 specifies the 3D dimensions of 160×160×160 for the fine grid and the grid ratio 144 is 2 to 1. Consequently, the fine grid is a 160×160×160 mesh of 4,096,000 voxels, the coarse grid is an 80×80×80 mesh of 512,000 "coarse" voxels, and the fine grid and the coarse grid represent the same portion of 3D space. In some other embodiments, the fine grid size 142 specifies the 3D dimensions of 160×160×160 for the fine grid and the grid ratio 144 is 2 to 1. Consequently, the fine grid is a 160×160×160 mesh of 4,096,000 voxels, the coarse grid is a 40×40×40 mesh of 64,000 coarse voxels, and the fine grid and the coarse grid represent the same portion of 3D space.

As described in greater detail below, in some embodiments, the trained machine learning model 192 is generated and subsequently invoked based on any number of model blocks (not shown). Each of the model blocks defines a different portion of the 3D space associated with both the fine grid and the coarse grid. The fine block size 146 defines the 3D dimensions of the model blocks relative to the fine grid. As described in greater detail below, the model blocks associated with training the trained machine learning model 192 can differ from the model blocks associated with invoking the trained machine learning model 192. The model blocks associated with training the trained machine learning model 192 are also referred to herein as "training blocks," and the model blocks associated with invoking the trained machine learning model 192 are also referred to herein as "inference blocks."

The shape definition 148 characterizes, without limitation, any number and/or types of aspects of the initial shape associated with the topology optimization problem in any technically feasible fashion. The optimized shape 198 is a solution for the topology optimization problem associated with the specification 132. More precisely, the optimized shape 198 is a version of the initial shape that is topologically optimized as per the parameter set 140. The topology optimization application 120 can generate and specify the optimized shape 198 in any technically feasible fashion.

Although not shown, in some embodiments, any number of instances of the topology optimization application 120 can each solve any number of different topology optimization problems sequentially, in parallel, or in any combination thereof. Each of the topology optimization problems is associated with a different one of any number of specifications 132. For each of the topology optimization problems, the associated instance of the topology optimization application 120 generates a different optimized shape 198

As shown, in some embodiments, the topology optimization application 120 includes, without limitation, the specification 132, a mesh engine 134, a workflow 150, a fine grid engine 160, and a coarse grid engine 170. In some embodiments, the topology optimization application 120 performs any number and/or types of input, output, translation, etc., operations and orchestrates an overall topology optimization process that solves the topology optimization problem associated with the specification 132.

In some embodiments, after acquiring the specification 132, the topology optimization application 120 inputs the fine grid size 142 and the shape definition 148 into the mesh engine 134. In response, the mesh engine 134 generates and outputs a shape 128(0) that is a representation of the initial shape associated with the topology optimization problem defined by the specification 132. In some embodiments, the shape 128(0) is a 3D mesh that includes, without limitation, any number of fine shape elements (not shown in FIG. 1), where each of the fine shape elements corresponds to a different voxel in the fine grid and specifies, without limitation, any number and/or type of values.

For instance, in some embodiments, the fine grid size 142 is 160×160×160 and the mesh engine 134 generates the shape 128(0) that includes, without limitation, 3,096,000 fine shape elements. The mesh engine 134 can generate the shape 128(0) in any technically feasible fashion and in any format. In some embodiments, the mesh engine 134 performs any number and types of conversion operations, meshing operations, partitioning operations, or any combination thereof based on the shape definition 148 and the fine grid size 142 to generate the shape 128(0).

In some embodiments, the mesh engine 134 generates the shape 128(0) in accordance with a Spatial Data Format ("SDF"). In SDF, each of the fine shape elements includes, without limitation, any amount and/or types of spatial data and optionally any number and/or types of attributes. In some embodiments, each of the fine shape elements includes, without limitation, a signed distance field that represents the associated spatial data. In some embodiments, the absolute value of each signed distance field correlates to a distance from the surface of the represented shape (e.g., the shape 128(0)). In the same or other embodiments, negative values, positive values, and zero values for signed distance fields specify portions of the represented shape that are inside, outside, and on the surface of the represented shape, respectively. In some other embodiments, each of the fine shape elements includes, without limitation, a density field that represents the associated spatial data.

In some embodiments, in addition to the spatial data, each of the fine shape elements includes, without limitation, a value for a keep-in label. In some embodiments, the values for the keep-in labels correspond to keep-ins specified in the shape definition 148. If a keep-in label has a value of true, then the associated spatial data corresponds to a keep-in and is not to be modified. Otherwise, the associated spatial data can be modified. The mesh engine 134 can generate the values for the keep-in labels in any technically feasible fashion.

In some embodiments, the topology optimization application 120 determines and executes the workflow 150 based on the specification 132. The workflow 150 describes, without limitation and in any technically feasible fashion, how the topology optimization application 120 configures the fine grid engine 160, the coarse grid engine 170, and training application 190 to solve the topology optimization problem. In some embodiments, the workflow 150 describes, without limitation, how and/or when the topology optimization application 120 routes any amount and/or types of data between any number of the topology optimization application 120, the mesh engine 134, the fine grid engine 160, the coarse grid engine 170, and the training application 190, in any combination. The workflow 150 can describe how the topology optimization application 120 routes any amount and/or types of data implicitly, explicitly, or in any combination thereof.

In some embodiments, to solve the topology optimization problem, the topology optimization application 120 sequentially orchestrates Z topology optimization iterations that generate shapes 128(1)-128(Z) (not explicitly shown), respectively, where Z can be any positive integer. For explanatory purposes only, the shapes 128(0)-128(Z) are also referred to herein collectively as "the shapes 128" and individually as "the shape 128." As denoted herein, for an integer i from 0 to (Z−1), one of the inputs to the $i^{th}$ topology optimization iteration is the shape 128(i) and one of the outputs of the $i^{th}$ topology optimization iteration is the shape 128(i+1).

The topology optimization application 120 can determine the final topology optimization iteration—denoted herein as the $(Z-1)^{th}$ topology optimization iteration—in any technically feasible fashion. In some embodiments, the topology optimization application 120 determines the final topology optimization iteration based on a completion criterion that specifies a required convergence of the shape 128(Z) with a design objective. After the topology optimization application 120 finishes executing the final topology optimization iteration, the topology optimization application 120 sets the optimized shape 198 equal to the shape 128(Z) that is the output of the final topology optimization iteration.

As shown, in some embodiments, the workflow 150 includes without limitation, fine grid phases 152(0)-152(R), a training phase 154, and coarse grid phases 156(1)-156(R), where R can be any positive integer. For explanatory purposes only, the fine grid phases 152(0)-152(R) are also referred to herein collectively as "the fine grid phases 152" and individually as "the fine grid phase 152." The coarse grid phases 156(1)-156(R) are also referred to herein collectively as "the coarse grid phase 156" and individually as "the coarse grid phase 156." In some other embodiments, the workflow 150 can include any number of the fine grid phases 152, any number of the training phases 154, and any number of the coarse grid phases 156, in any combination.

In some embodiments, the topology optimization application 120 distributes the Z topology optimization iterations across the fine grid phases 152 and the coarse grid phases 156. The topology optimization application 120 configures the fine grid engine 160 to execute the topology optimization iterations included in the fine grid phases 152 and the coarse grid engine 170 to execute the topology optimization iterations included in the coarse grid phases 156. For explanatory purpose only, at any given point in time while executing the topology optimization iterations, the topology optimization application 120 is in a "current grid phase" that is one of the fine grid phases 152 or one of the coarse grid phases 156.

In some embodiments, the topology optimization application 120 executes the fine grid phases 152 and the coarse grid phases 156 in a sequential and alternating fashion (as per the workflow 150). In the same or other embodiments, the topology optimization application 120 configures the training application 190 to execute the training phase 154 at least partially in parallel with any number of the fine grid phases 152 and any number of the coarse grid phases 156.

In some embodiments, to initialize the workflow 150, the topology optimization application 120 executes the fine grid phase 152(0) and the training phase 154 at least partially in parallel. After the fine grid phase 152(0) is complete, the topology optimization application 120 sequentially executes the coarse grid phase 156(1) and the fine grid phase 152(1). Although not shown, sequentially and for each integer i from 2 through (R−1), the topology optimization application 120 then executes the coarse grid phase 156(i) followed by the fine grid phase 152(i). Subsequently, as shown, the topology optimization application 120 sequentially executes the coarse grid phase 156(R) followed by the fine grid phase 152(R).

Each of the fine grid phases 152 includes, without limitation, a number of topology optimization iterations that the topology optimization application 120 performs via the fine grid engine 160. In some embodiments, the number of iterations can optionally vary across the fine grid phases 152. As depicted in italics, in some embodiments, the fine grid phase 152(0) is associated with N topology optimization iterations and each of the fine grid phases 152(1)-152(R) are associated P topology optimization iterations. Consequently, in such embodiments, the topology optimization application 120 performs a total of N+R*P topology optimization iterations via the fine grid engine 160.

Each of the coarse grid phases 156 includes, without limitation, a number of topology optimization iterations that the topology optimization application 120 performs via the coarse grid engine 170. As described in greater detail below, the coarse grid engine 170 uses the trained machine learning model 192. As depicted in italics, in some embodiments, each of the coarse grid phases 156 is associated with M topology optimization iterations. Consequently, in such embodiments, the topology optimization application 120 performs a total of M*R topology optimization iterations via the coarse grid engine 170. In some other embodiments, the number of iterations can optionally vary across the coarse grid phases 156.

The topology optimization application 120 can determine the number of topology optimization iterations to perform in each of the fine grid phases 152 and each of the coarse grid phases 156 in any technically feasible fashion. In some embodiments, values for N, M, and P are specified in the parameter set 140. As described in greater detail below, in some embodiments, the training application 190 generates the trained machine learning model 192 based on any number of iteration datasets 178 (not explicitly shown) that are optionally generated by the fine grid engine 160. In the same or other embodiments, the coarse grid engine 170 uses the trained machine learning model 192. Accordingly, in some embodiments, the value for N is selected to ensure that the trained machine learning model 192 is trained based on a minimum number of the iteration datasets 178 before the topology optimization application 120 executes any of the coarse grid phases 156.

Each of the iteration datasets 178 is a different instance of the iteration dataset 178. For explanatory purposes only, the iteration datasets 178 are also referred to herein individually as "the iteration dataset 178" and collectively as "the iteration datasets 178." Furthermore, parenthetical alphanumeric character(s) are used to identify different instances of the iteration dataset 178 where needed For explanatory purposes only, the functionality of the fine grid engine 160 is described herein in the context of an exemplary topology optimization iteration that is denoted as an $x^{th}$ iteration. To perform the $x^{th}$ iteration via the fine grid engine 160, the topology optimization application 120 inputs the shape 128(x) and any portion (including none or all) of the parameter set 140 into the fine grid engine 160. In response, the fine grid engine 160 performs any number and/or types of topology optimization operations on the shape 128(x) to generate the shape 128(x+1). In some embodiments, the topology optimization application 120 optionally configures the fine grid engine 160 to generate the iteration dataset 178(x) that includes, without limitation, any amount and/or type of data that is relevant to generating the trained machine learning model 192.

As shown, in some embodiments, the fine grid engine 160 includes, without limitation, a structural analyzer 162(1) and a shape optimizer 168. In some embodiments, the structural analyzer 162(1) is an instance of a structural analyzer 162 (not shown). The fine grid engine 160 inputs the shape 128(x) and any portion (including all or none) of the parameter set 140 into the structural analyzer 162(1). In response, the structural analyzer 162(1) performs any number and/or type of structural analysis operations based on the shape 128(x) and any number of the parameter values included in the parameter set 140 to generate and output a fine analysis result 166(x).

The portion of the parameter set 140 that the structural analyzer 162(1) uses can include, without limitation, any amount and/or type of data that is relevant to structural analysis of the shape 128(x). In some embodiments, the portion of the parameter set 140 that the structural analyzer 162(1) uses includes, without limitation, any number of parameter values associated with manufacturing (e.g., a material, a manufacturing process, etc.), load use cases, and so forth.

In some embodiments, the fine analysis result $166(x)$ includes, without limitation, any amount and/or type of structural analysis data associated with the responses of each of the fine shape elements included in the shape $128(x)$ to any number of load use cases. In the same or other embodiments, the structural analysis data includes, without limitation, a different discrete portion of structural analysis data for each voxel included in the fine grid.

For instance, in some embodiments, the fine analysis result $166(x)$ includes, without limitation, a different strain energy value (not shown) for each of the fine shape elements included in the shape $128(x)$ and therefore for each voxel included in the fine grid. In the same or other embodiments, the fine analysis result $166(x)$ can include, without limitation, any number of strain energy values, any number of displacements, any number of rotations, any amount and/or types of other structural analysis data, or any combination thereof. Because the fine analysis result $166(x)$ specifies data for each of the fine shape elements, the resolution of the fine analysis result $166(x)$ is equal to the resolution of the shape $128(x)$.

As shown, in some embodiments, the shape optimizer 168 performs, without limitation, any number and/or types of topology optimization operations on the shape $128(x)$ based on the fine analysis result $166(x)$ and any portion (including all or none) of the parameter set 140 to generate the shape $128(x+1)$. The portion of the parameter set 140 that the shape optimizer 168 uses can include, without limitation, any amount and/or type of data that is relevant to topology optimization of the shape $128(x)$. In some embodiments, the portion of the parameter set 140 that the shape optimizer 168 uses includes, without limitation, any number and/or types of parameter values associated with design constraints, any number and/or types of parameter values associated with design objectives, etc. In the same or other embodiments, the shape optimizer 168 generates the shape $128(x+1)$ that is more convergent with one or more design objectives than the shape $128(x)$.

In some embodiments, after generating and outputting the shape $128(x+1)$, the fine grid engine 160 optionally generates the iteration dataset $178(x)$. The iteration dataset $178(x)$ includes, without limitation, any amount and/or types of data associated with the $x^{th}$ iteration. As described in greater detail below in conjunction with FIG. 2, in some embodiments, the iteration dataset $178(x)$ includes, without limitation, the shape $128(x)$, the fine analysis result $166(x)$, and the shape $128(x+1)$. In the same or other embodiments, the fine grid engine 160 stores the iteration dataset $178(x)$ in any memory that is accessible to the training application 190 and/or transmits the iteration dataset $178(x)$ to the training application 190. As depicted with a dashed arrow and a dashed box, in some embodiments, the fine grid engine 160 stores the iteration dataset $178(x)$ in the memory 116(2) of the compute instance 110(2).

As shown, in some embodiments, the topology optimization application 120 configures the fine grid engine 160 to generate the iteration datasets 178(1)-178(N), where N is the total number of topology optimization iterations included in the fine grid phase 152(0). In some other embodiments, the topology optimization application 120 can configure the fine grid engine 160 to generate any number of the iteration datasets 178 during any number (including none or all) of the topology optimization iterations included in any number of the fine grid phase 152. For instance, in some embodiments, the topology optimization application 120 configures the fine grid engine 160 to generate a different iteration dataset 178 when executing each of the topology optimization iterations during each of the fine grid phases 152. In the same or other embodiments, the fine grid engine generates N+R*P different iteration datasets 178.

In some embodiments, the topology optimization application 120 configures the training application 190 to execute the training phase 154 based on the iteration datasets 178 and any portion of the parameter set 140. As described in greater detail below in conjunction with FIGS. 4 and 5, in some embodiments, the training application 190 initializes a current machine learning model (not shown in FIG. 1) to an untrained machine learning model or a pre-trained machine learning model. Upon acquiring (e.g., receiving from the fine grid engine 160, reading from the memory 116(2), etc.) the iteration dataset $178(x)$, the training application 190 generates a coarse shape $174(x)$ (not shown in FIG. 1) and a coarse analysis result $176(x)$ (not shown in FIG. 1) based on the grid ratio 144. The coarse shape $174(x)$ and the coarse analysis result $176(x)$ are downsampled versions of the shape $128(x)$ and the fine analysis result $166(x)$, respectively, that correspond to the coarse grid.

The training application 190 can generate the coarse shape $174(x)$ and the coarse analysis result $176(x)$ in any technically feasible fashion and in any formats. In some embodiments, the coarse shape $174(x)$ is a 3D mesh that includes, without limitation, any number of coarse shape elements (not shown in FIG. 1). Each of the coarse shape elements corresponds to a different coarse voxel in the coarse grid and specifies, without limitation, any number and/or type of values. Accordingly, the resolution of the coarse shape $174(x)$ is defined by the resolution of the shape $128(x)$ and the grid ratio 144.

In some embodiments, the coarse analysis result $176(x)$ includes, without limitation, a different discrete portion of structural analysis data for each of the coarse shape elements included in the coarse shape $174(x)$. In the same or other embodiments, the training application 190 generates the coarse analysis result $176(x)$ that includes, without limitation, a different discrete portion of structural analysis data for each voxel included in the coarse grid. For instance, in some embodiments, the coarse analysis result $176(x)$ includes, without limitation, different strain energy value for each for each of the coarse shape elements included in the coarse shape $174(x)$ and therefore for each voxel included in the coarse grid. Accordingly, the resolution of the coarse analysis result $176(x)$ is equal to the resolution of the coarse shape $174(x)$.

The training application 190 then generates a different training set (not shown in FIG. 1) for each of any number of training blocks based on the fine block size 146, the shape $128(x)$, the coarse shape $174(x)$, the coarse analysis result $176(x)$, and the shape $128(x+1)$. In some embodiments, any number of the training blocks can partially overlap with any number of the other training blocks. The training application 190 can determine the training blocks in any technically feasible fashion. As described in greater detail below in conjunction with FIG. 4, in some embodiments, the training application 190 determines the training blocks based on the fine block size 146 and a fine step size (not shown in FIG. 1) that is included in the parameter set 140.

Although not shown in FIG. 1, in some embodiments, each of the training sets includes, without limitation, a fine input block, a coarse block, a coarse result block, and a fine output block that correspond to the associated training block. The fine input block and the fine output block are portions of the shape 128(x) and the shape 128(x+1), respectively, that correspond to the portion of the 3D space defined by the associated training block. The coarse block is a portion of the coarse shape 174(x) that corresponds to the fine input block. The coarse result block is an optionally normalized portion of the coarse analysis result 176(x) that corresponds to the coarse block.

In some embodiments, the training application 190 incrementally trains the current machine learning model based on the training datasets to map a fine input block, a coarse block, and a coarse result block to a fine output block. The fine output block is a prediction of the associated block of the shape 128(i+1) that would be generated by the fine grid engine 160 based on the shape 128(i), where i can be any integer.

In some embodiments, the topology optimization application 120 configures the training application 190 to repeatedly save the current machine learning model as, sequentially, the trained machine learning models $192_1$-$192_Q$. The topology optimization application 120 can configure the training application 190 to save the current machine learning model based on any amount and/or types of criteria. For instance, in some embodiments, the parameter set 140 includes, without limitation, any number and/or type of parameter values that are associated with activating a trigger (e.g., a time interval between activations, a number of the iteration datasets 178 received between activations, etc.). When activated, the trigger causes the training application 190 to save the current machine learning model.

Note that the techniques used to generate the trained machine learning model 192 and the functionality of the trained machine learning model 192 described herein are illustrative rather than restrictive and can be altered without departing from the broader spirit and scope of the invention. Many modifications and variations will be apparent to those of ordinary skill in the art without departing from the scope and spirit of the described embodiments and techniques.

For instance, in some other embodiments, the training application 190 can generate any type of trained machine learning model 192 that can be used to generate a modified version of the shape 128 that is associated with a given resolution based on any amount and/or types of structural analysis data that is associated with a lower resolution. In the same or other embodiments, the functionality of the topology optimization application 120, the fine grid engine 160, and the coarse grid engine 170 are modified accordingly.

For explanatory purposes only, the functionality of the coarse grid engine 170 is described herein in the context of an exemplary topology optimization iteration that is denoted as a $y^{th}$ iteration. To perform the $y^{th}$ iteration via the coarse grid engine 170, the topology optimization application 120 inputs the shape 128(y) and any portion (including none or all) of the parameter set 140 into the coarse grid engine 170. In response, the coarse grid engine 170 uses the trained machine learning model 192 to generate the shape 128(y+1). In some embodiments, the shape 128(y+1) is predicted to be more convergent with one or more design objectives than the shape 128(y). In the same or other embodiments, the shape 128(y+1) is a modified version of the shape 128(y) that is predicted to be topologically optimized with respect to the shape 128(y) as per one or more design objectives.

As shown, in some embodiments, the coarse grid engine 170 includes, without limitation, a remesh engine 172, a structural analyzer 162(2), and an inference engine 180. In some embodiments, the coarse grid engine 170 inputs the shape 128(y) and the grid ratio 144 into the remesh engine 172. In response, the remesh engine 172 converts the shape 128(y) to a coarse shape 174(y). The coarse shape 174(y) is a downsampled version of the shape 128(y), is associated with the coarse grid, and can be represented in any technically feasible fashion. For explanatory purposes only, the downsampled versions of any number of the shapes 128 that are associated with the coarse grid are also referred to referred to herein collectively as "the coarse shapes 174" and individually as "the coarse shape 174."

The remesh engine 172 can generate the coarse shape 174(y) in any technically feasible fashion and in any format. In some embodiments, the remesh engine 172 performs any number and/or types of downsampling operations on the shape 128(y) based on the grid ratio 144 and/or the coarse grid to generate the coarse shape 174(y). Some examples of downsampling operations include, without limitation, field transfer operations, remeshing operations, and so forth. The remesh engine 172 generates the coarse shape 174(y) that has the same format as the shape 128(y). In some embodiments, the remesh engine 172 generates the coarse shape 174(y) in accordance with the SDF.

In some embodiments, the structural analyzer 162(2) is an instance of the structural analyzer 162. As shown, in some embodiments, the coarse grid engine 170 inputs the coarse shape 174(y) and any portion (including all or none) of the parameter set 140 into the structural analyzer 162(2). In response, the structural analyzer 162(2) performs any number and/or type of structural analysis operations based on the coarse shape 174(y) and any number of the parameter values included in the parameter set 140 to generate a coarse analysis result 176(y). The portion of the parameter set 140 that the structural analyzer 162(2) uses can include, without limitation, any amount and/or type of data that is relevant to structural analysis of the coarse shape 174(y). In some embodiments, the portion of the parameter set 140 that the structural analyzer 162(2) uses includes, without limitation, any number of parameter values associated with manufacturing (e.g., a material, a manufacturing process, etc.), load use cases, and so forth.

In some embodiments, the coarse analysis result 176(y) includes, without limitation, any amount and/or types of structural analysis data associated with the responses of each of the coarse shape elements included in the coarse shape 174(y) to any number of load use cases. For instance, in some embodiments, the coarse analysis result 176(y) includes, without limitation, a different strain value (not shown) for each of the coarse shape elements included in the coarse shape 174(y). In the same or other embodiments, the coarse analysis result 176(y) can include, without limitation, any number and/or types of strain energy values, any number of displacements, any number of rotations, any amount and/or types of other structural analysis data, or any combination thereof. Because the coarse analysis result 176(x) specifies data for each of the coarse shape elements, the resolution of the coarse analysis result 176(x) is equal to the resolution of the coarse shape 174(y) and is therefore lower than the resolution of the shape 128(y).

As shown, in some embodiments, the coarse grid engine 170 inputs the shape 128(y), the coarse shape 174(y), the coarse analysis result 176(y), and any portion of the parameter set 140 into the inference engine 180. In response, the inference engine 180 generates the shape 128(y+1). In some embodiments, the shape 128(y+1) is predicted to be more convergent with one or more design objectives than the shape 128(y). In the same or other embodiments, the shape 128(y+1) is a modified version of the shape 128(y) that is predicted to be topologically optimized with respect to the shape 128(y) as per one or more design objectives. Notably, the shape 128(y+1) is associated with the fine grid and has the same resolution as the shape 128(y). The inference engine 180 can use the trained machine learning model 192 to generate the shape 128(y+1) in any technically feasible fashion.

As described in greater detail below in conjunction with FIG. 2, in some embodiments, the inference engine 180 performs any number and/or type of normalization operations on any portion of the coarse analysis result 176(y) to generate a normalized coarse analysis result (not shown). The inference engine 180 then determines any number of non-overlapping inference blocks based on the fine block size 146. Together, the non-overlapping inference blocks span the 3D space associated with the fine grid and the coarse grid. In some embodiments, the fine block size 146 defines the 3D dimensions of each of the inference blocks with respect to the fine grid. In the same or other embodiments, the fine block size 146 and the grid ratio 144 define the 3D dimensions of each of the inference blocks with respect to the coarse grid.

In some embodiments, based on the inference blocks, the inference engine 180 partitions the shape 128(x), the coarse shape 174(x), and the normalized coarse analysis result into fine input blocks, coarse blocks, and coarse result blocks, respectively. For each of the inference blocks, the inference engine 180 generates an inference set (not shown in FIG. 1) that includes, without limitation, the fine input block, the coarse block, and the coarse result block corresponding to the inference block.

For instance, in some embodiments, the fine block size is 4×4×4 and the grid ratio 144 is 2 to 1. In some such embodiments, the inference engine 180 partitions the shape 128(x) into non-overlapping 4×4×4 fine inputs blocks that each correspond to a different block of 4×4×4 fine shape elements. The inference engine 180 partitions the coarse shape 174(x) into non-overlapping 2×2×2 coarse blocks that each correspond to a different one of the 4×4×4 fine input blocks. The inference engine 180 partitions the normalized coarse analysis result into non-overlapping 2×2×2 coarse result blocks that each correspond to a different one of the 2×2×2 coarse blocks and therefore a different one of the 4×4×4 fine input blocks. For each of the inference blocks, the inference engine 180 generates a different inference set that includes, without limitation, the 4×4×4 fine input block, the 2×2×2 coarse block, and the 2×2×2 coarse result block that correspond to the inference block.

In some embodiments, the inference engine 180 acquires the most recent version of the trained machine learning model 192 in any technically feasible fashion. For instance, in some embodiments, the inference engine 180 reads the trained machine learning model $192_q$, where q is an integer between 1 and Q that denotes the most recently generated version of the trained machine learning model 192, from the memory 116(2). In the same or other embodiments, the integer q ranges over time from 1 to Q and, as a result, the version of the trained machine learning model 192 that the inference engine 180 uses can vary across the topology optimization iterations.

The inference engine 180 inputs each of the inference sets into the trained machine learning model $192_q$ and, in response, the trained machine learning model $192_q$ outputs a different fine output block for each of the inference sets. Each of the fine output blocks is a modified version of the associated fine input block and has the same resolution as the fine input block. Accordingly, each of the fine output blocks is a different modified portion of the shape 128(y). The inference engine 180 then aggregates the fine input blocks to generate the shape 128(y+1). In some embodiments, the shape 128(y+1) is predicted to be more convergent with one or more of the design objectives than the shape 128(y). In the same or other embodiments, the shape 128(y+1) is a modified version of the shape 128(y) that is predicted to be topologically optimized with respect to the shape 128(y) as per one or more design objectives.

Advantageously, because the coarse grid engine 170 generates the shape 128(y+1) based on the shape 128(y) and the coarse analysis result 176(y), the topology optimization application 120 can use the trained machine learning model 192 to reduce the computational complexity associated with solving the topology optimization problem. More precisely, because the coarse grid engine 170 configures the structural analyzer 162(2) to perform structural analysis on the coarse shape 174(y) instead of the shape 128(y), the structural analyzer 162(2) performs structural analysis operations at a coarser resolution. Therefore, the computational complexity associated with each of the topology optimization iterations performed by the coarse grid engine 170 is decreased relative to the computational complexity associated with each of the topology optimization iterations performed by the fine grid engine 160.

Note that the techniques described herein are illustrative rather than restrictive and can be altered without departing from the broader spirit and scope of the invention. Many modifications and variations on the functionality provided by the topology optimization application 120, the mesh engine 134, the fine grid engine 160, the coarse grid engine 170, the remesh engine 172, the structural analyzer 162, the shape optimizer 168, the inference engine 180, and the training application 190 will be apparent to those of ordinary skill in the art without departing from the scope and spirit of the described embodiments.

It will be appreciated that the system 100 shown herein is illustrative and that variations and modifications are possible. For example, the functionality provided by the topology optimization application 120, the mesh engine 134, the fine grid engine 160, the coarse grid engine 170, the remesh engine 172, the structural analyzer 162, the shape optimizer 168, the inference engine 180, and the training application 190 as described herein may be integrated into or distributed across any number of software applications (including one), and any number of components of the system 100. Further, the connection topology between the various units in FIG. 1 can be modified as desired.

Figure 2:
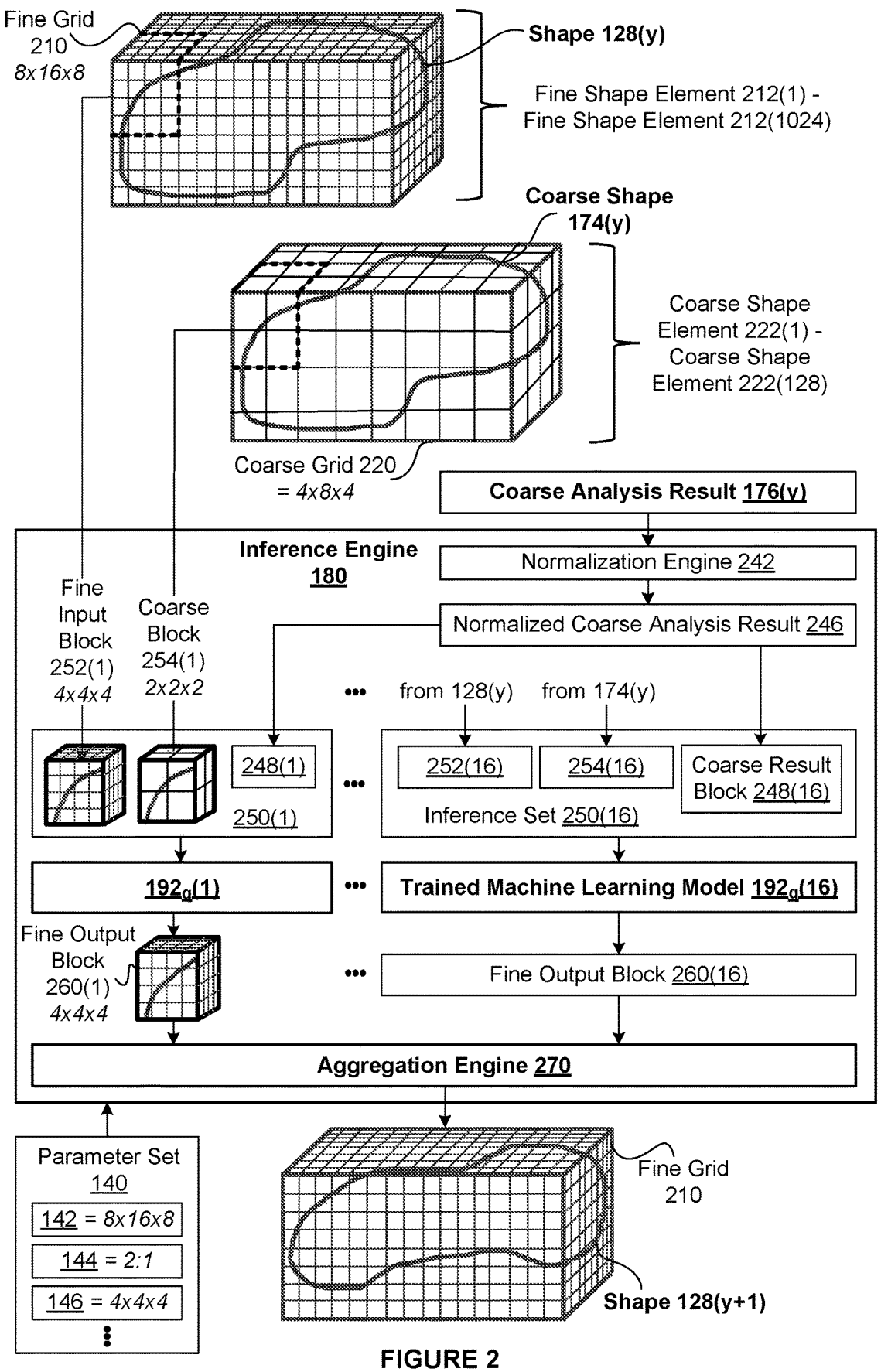
FIG. 2 is a more detailed illustration of the inference engine of FIG. 1, according to various embodiments.

FIG. 2 is a more detailed illustration of the inference engine 180 of FIG. 1, according to various embodiments. For explanatory purposes only, the functionality of the inference engine 180 is described in the context of a more generalized version of an exemplary embodiment depicted in FIG. 2. Subsequently, the functionality of the exemplary embodiment of the inference engine 180 depicted in FIG. 2 is described in detail.

As shown, the inference engine 180 generates the shape 128(y+1) based on any portion of the parameter set 140, the shape 128(y), the coarse shape 174(y), and the coarse analysis result 176(y), where y is an integer that can denote any of the topology optimization iterations that are performed by the coarse grid engine 170. As described previously herein in conjunction with FIG. 1, in some embodiments, the parameter set 140 includes, without limitation, the fine grid size 142, the grid ratio 144, the fine block size 146, and any number and/or types of other parameter values (indicated via an ellipsis) that are organized in any technically feasible fashion.

In some embodiments, the fine grid size 142 specifies the 3D dimensions of a fine grid 210 that defines a 3D mesh of voxels (not shown), where each voxel corresponds to a different portion of 3D space. In the same or other embodiments, each of the shapes 128 (including the shapes 128(*y*) and 128(*y*+1)) is a 3D mesh that includes, without limitation, a different instance of a fine shape element 212 (not explicitly depicted) for each of the voxels in the fine grid 210.

For explanatory purposes only, instances of the fine shape element 212, irrespective of whether the instances are explicitly depicted in any of the figures, are also referred to herein individually as "the fine shape element 212" and collectively as "the fine shape elements 212." Each of the fine shape elements 212 specifies, without limitation, any number and/or types of values associated with the corresponding voxel. Although not shown, in some embodiments, each of the fine shape elements 212 includes, without limitation, a signed distance field that represents the portion of the shape 128 associated with the corresponding voxel and a keep-in label.

In some embodiments, the grid ratio 144 specifies a ratio between the fine grid 210 and a coarse grid 220 that is a downsampled version of the fine grid 210. As referred to herein, the coarse grid 220 defines a 3D mesh of coarse voxels (not shown), where each coarse voxel corresponds to a different portion of 3D space. Each coarse voxel corresponds to multiple voxels in the fine grid 210. In the same or other embodiments, each of the coarse shapes 174 (including the coarse shape 174(*y*)) is a 3D mesh that includes, without limitation, a different instance of a coarse shape element 222 (not explicitly depicted) for each coarse voxel in the coarse grid 220.

For explanatory purposes only, instances of the coarse shape element 222, irrespective of whether the instances are explicitly depicted in any of the figures, are also referred to herein individually as "the coarse shape element 222" and collectively as "the coarse shape elements 222." Each of the coarse shape elements 222 corresponds to a different coarse voxel in the coarse grid 220 and specifies, without limitation, any number and/or type of values. Although not shown, in some embodiments, each of the coarse shape elements 222 includes, without limitation, a signed distance field that represents the portion of the coarse shape 174 associated with the corresponding coarse voxel and a keep-in label.

In some embodiments, each of the coarse analysis results 176 (including the coarse analysis result 176(*y*)) can specify any amount and/or types of structural analysis data for each of the coarse shape elements 222 included in a corresponding instance of the coarse shape 174. For instance, in some embodiments, the coarse analysis result 176(*y*) includes, without limitation, a different strain energy value (not shown) for each of the coarse shape elements 222 included in the coarse shape 174(*y*). For explanatory purposes only, the structural analysis data included in the coarse analysis result 176 is also referred to herein as "coarse structural analysis data" and "non-normalized coarse structural analysis data."

As shown, in some embodiments, the inference engine 180 includes, without limitation, a normalization engine 242, any number of instances of the trained machine learning model 192$_q$, and an aggregation engine 270. In some embodiments, the inference engine 180 inputs the coarse analysis result 176(*y*) into the normalization engine 242. In response, the normalization engine 242 performs any number and/or type of normalization operations on any portion of the coarse analysis result 176(*y*) in any technically feasible fashion to generate and output a normalized coarse analysis result 246. The normalized coarse analysis result 246 can include, without limitation, any amount and/or types of normalized structural analysis data, any amount and/or types of structural analysis data that is not normalized, or any combination thereof for each of the coarse shape elements 222 included in the coarse shape 174(*y*). For explanatory purposes only, the structural analysis data included in the normalized coarse analysis result 246 is also referred to herein as "coarse structural analysis data."

In particular, in some embodiments, the coarse analysis result 176 includes, without limitation, any number of strain energy values that are not bounded. As persons skilled in the art will recognize, strain energy distributions can vary substantially between different topology optimization iterations associated with the same topology optimization problem. To improve the robustness of the trained machine learning model 192, in some embodiments, the normalization engine 242 performs any number and/or types of normalization operations on any number of strain energy values included in the coarse analysis result 176(*y*).

For instance, in some embodiments, for each strain energy value included in the coarse analysis result 176(*y*), the normalization engine 242 sets a corresponding normalized strain energy value equal to the log of the z-score. The normalization engine 242 then generates the normalized coarse analysis result 246 that includes, without limitation, the normalized strain energy values, where each of the normalized strain energy values corresponds to a different one of the coarse shape elements 222 included in the coarse shape 174(*y*).

In some embodiments, the inference engine 180 generates any number of instances of an inference set 250 (not explicitly shown) based on the shape 128(*y*), the normalized coarse analysis result 246, the fine grid size 142, the grid ratio 144, and the fine block size 146. For explanatory purposes only, instances of the inference set 250, irrespective of whether the instances are explicitly depicted in any of the figures, are also referred to herein individually as "inference set 250" and collectively as "the inference sets 250."

Each of the inference sets 250 specifies a different set of values for the inputs of the trained machine learning model 192. The inference engine 180 can generate the inference sets 250 in any technically feasible fashion that is consistent with the inputs of the trained machine learning model 192. As described previously herein in conjunction with FIG. 1, in some embodiments, each of the inference sets 250 corresponds to a different non-overlapping inference block (not shown). The inference engine 180 can determine the inference blocks in any technically feasible fashion.

In some embodiments, the fine block size 146 defines the 3D dimensions of each of the inference blocks with respect to the fine grid 210. The inference engine 180 defines the non-overlapping inference blocks based on the fine block size 146 such that, together, the inference blocks span the 3D space associated with both the fine grid 210 and the coarse grid 220. Notably, the fine block size 146 and the grid ratio 144 define the 3D dimensions of each of the inference blocks with respect to the coarse grid 220.

To generate the inference sets 250, in some embodiments, the inference engine 180 partitions the shape 128(*y*) into non-overlapping instances of a fine input block 252 (not explicitly shown), where each of the instances of the fine input block 252 corresponds to a different one of the inference blocks. For explanatory purposes only, instances of the fine input block 252, irrespective of whether the instances are explicitly depicted in any of the figures, are also referred to herein individually as "fine input block 252" and collectively as "the fine input blocks 252." Each of the fine input blocks 252 that is derived from the shape 128(y) includes, without limitation, a different subset of the fine shape elements 212 included in the shape 128(y).

In the same or other embodiments, the inference engine 180 partitions the coarse shape 174(y) into non-overlapping instances of a coarse block 254 (not explicitly shown), where each of the instances of the coarse block 254 corresponds to a different one of the inference blocks. For explanatory purposes only, instances of the coarse block 254, irrespective of whether the instances are explicitly depicted in any of the figures, are also referred to herein individually as "the coarse block 254" and collectively as "the coarse blocks 254." Each of the coarse blocks 254 derived from the coarse shape 174(y) includes, without limitation, a different subset of the coarse shape elements 222 included in the coarse shape 174(y).

In some embodiments, the inference engine 180 partitions the normalized coarse analysis result 246 into non-overlapping instances of a coarse result block 248 (not explicitly shown), where each of the instances of the coarse result block 248 corresponds to a different one of the inference blocks. For explanatory purposes only, instances of the coarse result block 248, irrespective of whether the instances are explicitly depicted in any of the figures, are also referred to herein individually as "the coarse result block 248" and collectively as "the coarse result blocks 248."

Each of the coarse result blocks 248 corresponds to a different one of the coarse blocks 254 and includes, without limitation, any amount and/or type of normalized structural analysis data, any amount and/or type of structural analysis data that is not normalized, or any combination thereof that is associated with the coarse block 254. For instance, in some embodiments, each of the coarse result blocks 248 includes the normalized strain energy values that are associated with the coarse shape elements 222 included in a different one of the coarse blocks 254.

In some embodiments, the total number of the fine input blocks 252, the total number of the coarse blocks 254, the total number of the coarse result blocks 248, and the total number of the inference blocks are equal. Furthermore, each of the inference blocks specifies a different portion of 3D space that is associated with one of the fine input blocks 252, one of the coarse blocks 254, and one of the coarse result blocks 248.

For each of the inference blocks, the inference engine 180 generates a different one of the inference sets 250 that includes, without limitation, the fine input block 252, the coarse block 254, and the coarse result block 248 that correspond to the inference block. Together, in some embodiments, the inference sets 250 represent, without limitation, the fine shape elements 212 included in the shape 128(y), the coarse shape elements 222 included in the coarse shape 174(y), and the normalized strain energy values included in the normalized coarse analysis result 246 derived from the coarse analysis result 176(y).

In some other embodiments, the inference engine 180 can generate any number of the inference sets 250 based on any number and/or types of parameter values, the shape 128(y), the coarse shape 174(y), and the coarse analysis result 176(y) in any technically feasible fashion. In the same or other embodiments, the normalization engine 242 is omitted from the inference engine 180, and the inference engine 180 partitions the coarse analysis result 176(y) to generate the coarse result blocks 254.

In some embodiments, the inference engine 180 inputs each of the inference sets 250 into a different instance of the trained machine learning model $192_q$. For explanatory purposes only, "the trained machine learning model $192_q$" as used herein refers to any instance of the most recent version of the trained machine learning model 192, irrespective of whether the specific instance is depicted in any of the figures. In response, each instance of the trained machine learning model $192_q$ outputs a different instance of a fine output block 260.

In some other embodiments, the inference engine 180 inputs the inference sets 250 into any number of instances of the trained machine learning model $192_q$ sequentially, concurrently, or in any combination thereof. For instance, in some embodiments, the inference engine 180 sequentially inputs the inference sets 250 into a single instance of the trained machine learning model $192_q$. In response, the single instance of the trained machine learning model $192_q$, sequentially outputs a different instance of the fine output block 260 for each of the inference sets 250. For explanatory purposes only, instances of the fine output block 260, irrespective of whether the instances are explicitly depicted in any of the figures, are also referred to herein individually as "the fine output block 260" and collectively as "the fine output blocks 260."

In some embodiments, for each instance of the inference set 250, the trained machine learning model 192 modifies the fine input block 252 based on the coarse block 254 and the coarse result block 248 to generate the fine output block 260. In the same or other embodiments, each of the fine output blocks 260 is predicted to be more convergent with one or more design objectives than the fine input block 252 used to generate the fine output block 260. Each of the fine output blocks 260 and each of the fine input blocks 252 includes, without limitation, the same total number of the fine shape elements 212.

As shown, in some embodiments, the aggregation engine 270 generates the shape 128(y+1) based on the fine output blocks 260. The aggregation engine 270 can generate the shape 128(y+1) in any technically feasible fashion. In some embodiments, the aggregation engine 270 performs any number and/or type of aggregation operations on the fine output blocks 260 based on the corresponding portions of 3D space to generate the shape 128(y+1).

Notably, the total number of the fine shape elements 212 included in the shape 128(y+1) is equal to the total number of the fine shape elements 212 included in the shape 128(y). Therefore, the resolution of the shape 128(y+1) is equal to the resolution of the shape 128(y). Advantageously, in some embodiments, the shape 128(y+1) is predicted to be more convergent with one or more design objectives than the shape 128(y). In the same or other embodiments, the shape 128(y+1) is a modified version of the shape 128(y) that is predicted to be topologically optimized with respect to the shape 128(y) as per one or more design objectives.

For explanatory purposes only, FIG. 2 depicts an exemplary embodiment associated with exemplary values for the fine grid size 142, the grid ratio 144, and the fine block size 146 that are depicted in italics and exemplary boundaries of the shape 128(y) and the coarse shape 174(y) that are depicted via thick black lines. As shown, in the exemplary embodiment, the fine grid size 142 specifies that the dimensions of the fine grid 210 are 8×16×8, the grid ratio 144 between the fine grid 210 and the coarse grid 220 is 2:1, and the fine block size 146 is 4×4×4.

In the embodiment depicted in FIG. 2, because the fine grid size 142 is 8×16×8, the fine grid 210 includes, without limitation, 1024 voxels. Accordingly, the shape 128(y) includes, without limitation, the fine shape elements 212(1)-212(1024). And because the grid ratio 144 is 2:1, the dimensions of the coarse grid 220 are 4×8×4. The coarse grid 220 therefore includes, without limitation, 128 coarse voxels. Accordingly, the coarse shape 174(y) includes, without limitation, the coarse shape elements 222(1)-222(128).

For explanatory purposes only, in the embodiment depicted in FIG. 2, the coarse analysis result 176(y) includes without limitation, 128 different strain energy values (not shown), where each of the strain energy values is associated with a different one of the coarse shape elements 222(1)-222(128). The inference engine 180 inputs the coarse analysis result 176(y) into the normalization engine 242. In response, the normalization engine 242 generates the normalized coarse analysis result 246 that includes, without limitation, 128 different normalized strain energy values.

In some embodiments, the inference engine 180 determines 16 non-overlapping inference blocks based on the fine grid size 142 of 8×16×8 and the fine block size 146 of 4×4×4. Because the grid ratio 144 is 2:1, each of the inference blocks corresponds to a different 4×4×4 block of the fine shape elements 212 and a different 2×2×2 block of the coarse shape elements 222. For example, and as depicted via dashed lines, a first inference block corresponds to a 4×4×4 block of the fine shape elements 212 and a 2×2×2 block of the coarse shape elements 222.

For the exemplary embodiment depicted in FIG. 2, based on the inference blocks, the inference engine 180 partitions the shape 128(y), the coarse shape 174(y), and the normalized coarse analysis result 246 into the fine input block 252(1)-252(16), the coarse blocks 254(1)-254(16), and the coarse result blocks 248(1)-248(16), respectively. Each of the fine input blocks 252(1)-252(16) includes, without limitation, a different subset of 64 of the fine shape elements 212 included in the shape 128(y). Each of the coarse blocks 254(1)-254(16) includes, without limitation, a different subset of 16 of the coarse shape elements 222. Each of the coarse result blocks 248(1)-248(16) includes, without limitation, a different subset of 16 of the normalized strain energy values included in the normalized coarse analysis result 246.

The inference engine 180 generates the inference sets 250(1)-250(16) based on the fine input block 252(1)-252(16), the coarse blocks 254(1)-254(16), and the coarse result blocks 248(1)-248(16), Each of the inference sets 250 corresponds to a different inference block. For example, and as depicted via arrows and dashed lines, the inference set 250(1) corresponds to the first inference block. As shown, the inference set 250(1) includes, without limitation, the fine input block 252(1), the coarse block 254(1), and the coarse result block 248(1). As also shown, the inference set 250(16) includes, without limitation, the fine input block 252(16), the coarse block 254(16), and the coarse result block 248(16). Although not explicitly shown, for an integer i from 2 to 15, the inference set 250(i) includes, without limitation, the fine input block 252(i), the coarse block 254(i), and the coarse result block 248(i).

As depicted, for the exemplary embodiment depicted in FIG. 2, the inference engine 180 inputs the inference sets 250(1)-250(16) into the trained machine learning models $192_q(1)$-$192_q(16)$, respectively. In response, the trained machine learning models $192_q(1)$-$192_q(16)$, output the fine output blocks 260(1)-260(16), respectively. In some embodiments, the fine output blocks 260(1)-260(16) are modified versions of the fine input blocks 252(1)-252(16), respectively, that are predicted to be topologically optimized with respect to the fine input blocks 252(1)-252(16), respectively, as per one or more design objectives.

In the embodiment depicted in FIG. 2, the inference engine 180 aggregates the fine output blocks 260(1)-260(16) to generate the shape 128(y+1). Accordingly, the resolution of the shape 128(y+1) is equal to the resolution of the shape 128(y). As depicted, the shape 128(y+1) is more convergent with a design objective of "minimize mass" than the shape 128(y). More precisely, relative to the shape 128(y), the shape 128(y+1) includes, without limitation, less material and therefore has less mass.

Figure 3:
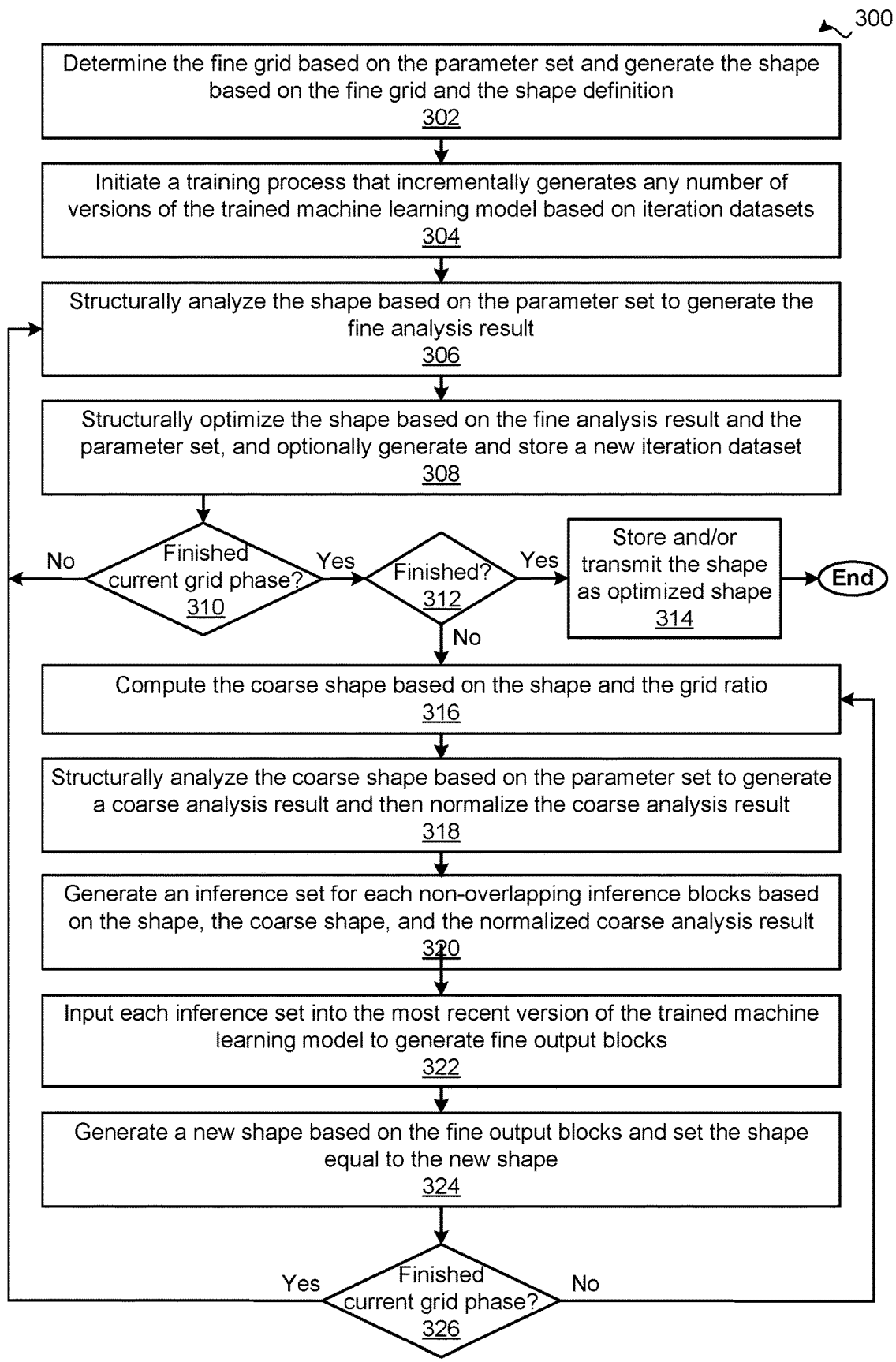
FIG. 3 is a flow diagram of method steps for solving a topology optimization problem when designing a 3D object, according to various embodiments.

FIG. 3 is a flow diagram of method steps for solving a topology optimization problem when designing a 3D object, according to various embodiments. Although the method steps are described with reference to the systems of FIGS. 1-2, persons skilled in the art will understand that any system configured to implement the method steps, in any order, falls within the scope of the present invention.

As shown, a method 300 begins a step 302, where the topology optimization application 120 determines the fine grid 210 based on the parameter set 140 and generates an initial version of the shape 128 based on the fine grid 210 and the shape definition 148. At step 304, the topology optimization application 120 initiates a training process that iteratively generates any number of versions of the trained machine learning model 192 based on the iteration datasets 178. The topology optimization application 120 can initiate the training process in any technically feasible fashion. For instance, in some embodiments, the topology optimization application 120 configures the training application 190 to execute the method steps described below in conjunction with FIG. 6.

At step 306, the fine grid engine 160 configures the structural analyzer 162 to structurally analyze the shape 128 based on the parameter set 140 to generate the fine analysis result 166. At step 308, the fine grid engine 160 configures the shape optimizer 168 to topologically optimize the shape 128 based on the fine analysis result 166 and the parameter set 140. As part of step 308, the fine grid engine 160 optionally generates and stores a new one of the iteration datasets 178.

At step 310, the topology optimization application 120 determines whether the topology optimization application 120 has finished the current grid phase. If, at step 310, the topology optimization application 120 determines that the topology optimization application 120 has not finished the current grid phase, then the method 300 returns to step 306, where the fine grid engine 160 configures the structural analyzer 162 to structurally analyze the shape 128.

If, however, at step 310, the topology optimization application 120 determines that the topology optimization application 120 has finished the current grid phase, then the method 300 proceeds to step 312. At step 312, the topology optimization application 120 determines whether the topology optimization application 120 has finished. The topology optimization application 120 can determine whether the topology optimization application 120 has finished in any technically feasible fashion (e.g., based on any number and/or types of completion criteria).

If, at step 312, the topology optimization application 120 determines that the topology optimization application 120 has finished, then the method 300 proceeds to step 314. At step 314, the topology optimization application 120 stores and/or transmits to any number and/or types of other software applications the newly modified version of the shape 128 as the optimized shape 198. The method 300 then terminates.

If, however, at step 312, the topology optimization application 120 determines that the topology optimization application 120 has not finished, then the method 300 proceeds directly to step 316. At step 316, the coarse grid engine 170 computes the coarse shape 174 based on the shape 128 and the grid ratio 144 specified in the parameter set 140. At step 318, the coarse grid engine 170 configures the structural analyzer 162 to structurally analyze the coarse shape 174 based on the parameter set 140 to generate the coarse analysis result 176, and then normalizes the coarse analysis result 176 to generate the normalized coarse analysis result 246.

At step 320, the inference engine 180 generates the inference set 250 for each non-overlapping inference block based on the shape 128, the coarse shape 174, and the normalized coarse analysis result 246. At step 322, the inference engine 180 inputs each of the inference sets 250 into the most recent version of the trained machine learning model 192 to computes the fine output blocks 260. At step 324, the aggregation engine 270 generates a new shape based on the fine output blocks 260 and then sets the shape 128 equal to the new shape.

At step 326, the topology optimization application 120 determines whether the topology optimization application 120 has finished the current grid phase. If, at step 326, the topology optimization application 120 determines that the topology optimization application 120 has not finished the current grid phase, then the method 300 returns to step 316, where the coarse grid engine 170 generates the coarse shape 174 based on the shape 128 and the grid ratio 144 specified in the parameter set 140.

If, however, at step 326, the topology optimization application 120 determines that the topology optimization application 120 has finished the current grid phase, then the method 300 returns to step 306, where the fine grid engine 160 structurally analyzes the shape 128. The method 300 continues to cycle though steps 306-326 until, at step 314, the topology optimization application 120 stores and/or transmits to any number and/or types of other software applications the newly modified version of the shape 128 as the optimized shape 198. The method 300 then terminates.

Figure 4:
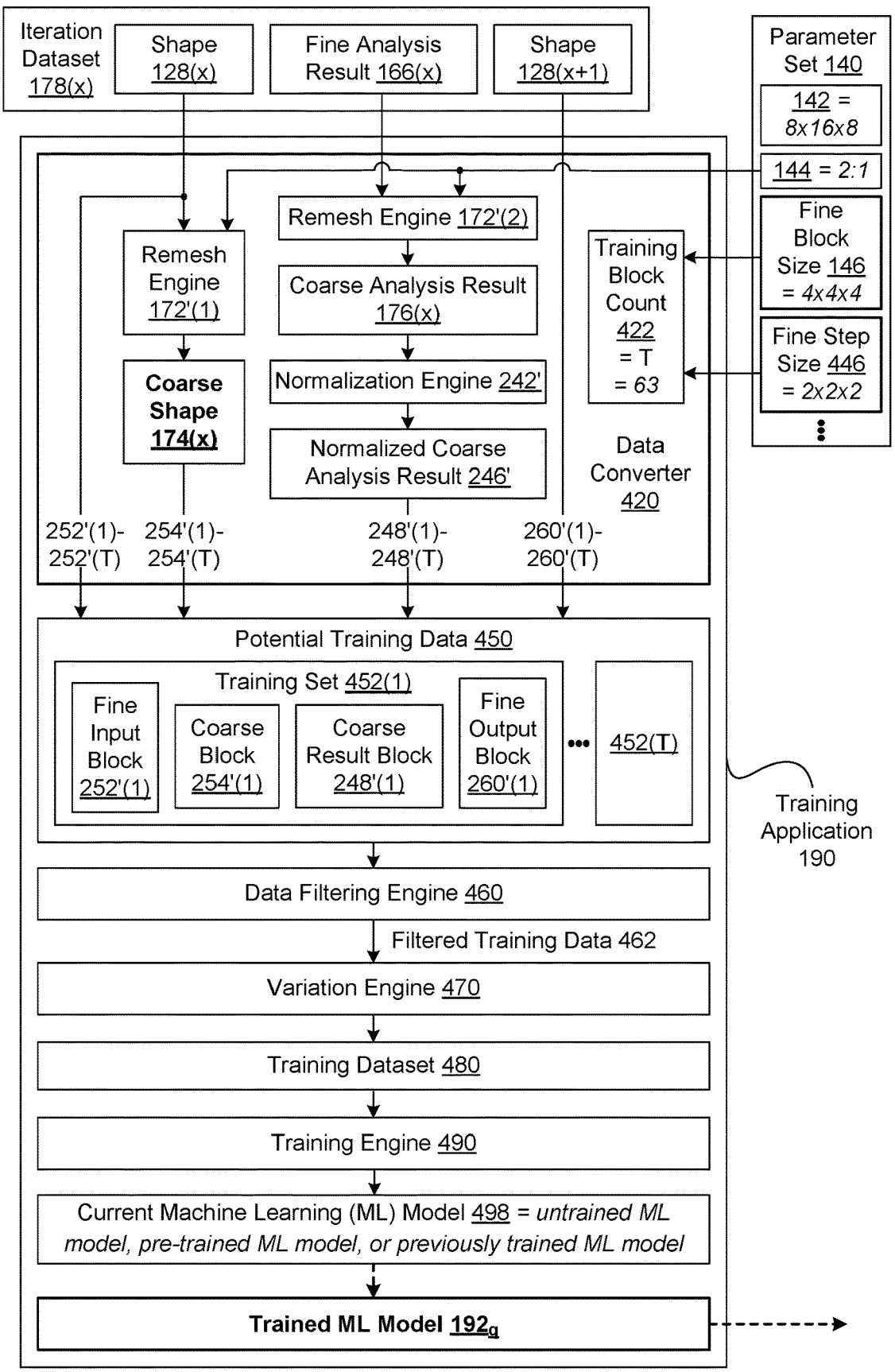
FIG. 4 is a more detailed illustration of the training application of FIG. 1, according to various embodiments.

Training a Machine Learning Model to Optimize Shapes Based on Lower Resolution Structural Analysis Data FIG. 4 is a more detailed illustration of the training application 190 of FIG. 1, according to various embodiments. As shown, in some embodiments, the training application 190 includes, without limitation, a data converter 420, a data filtering engine 460, a variation engine 470, a training engine 490, and a current machine learning model 498. For explanatory purposes only, a prime is used after the reference numbers of objects having different instances associated with the topology optimization application 120 and the training application 190 to distinguish the instances that are associated with the training application 190 where necessary.

During an initialization phase, the training application 190 can initialize the current machine learning model 498 in any technically feasible fashion. In some embodiments, the training application 190 initializes the current machine learning model 498 based on any number and/or types of untrained machine learning models, any number and/or types of pre-trained machine learning models, any number and/or types of trained machine learning models 192, or any combination thereof.

For instance, in some embodiments, the training application 190 sets the current machine learning model 498 equal to an untrained neural network. In some other embodiments, the training application 190 sets the current machine learning model 498 equal to a composite machine learning model. In some embodiments, the composite machine learning model includes, without limitation, any number and/or types of machine learning models that work together and can be trained independently, dependently, or any combination thereof. In yet other embodiments, the training application 190 sets the current machine learning model 498 equal to the trained machine learning model 192 that is associated with a related and previously solved topology optimization problem.

In some embodiments, during a subsequent training phase, the training application 190 sequentially acquires each of the iteration datasets 178. The training application 190 repeatedly performs machine learning operations on the current machine learning model 498 based on the iteration datasets 178 to generate any number of versions of the trained machine learning model 192. In some other embodiments, the training application 190 performs any number and/or type of operations to train the current machine learning model 498 based on any amount and/or type of data instead of or in addition to the iteration datasets 178.

In some embodiments, each version of the trained machine learning model 192 is associated with a different point in time and is equal to a version of the current machine learning model 498 that is trained based on a different number of the iteration datasets 178. Accordingly, the type of each version of the trained machine learning model 192 matches the type of the current machine learning model 498. As described in greater detail below in conjunction with FIG. 5, in some embodiments, each version of the trained machine learning model 192 is a trained neural network.

The training application 190 can generate any number of different versions of the trained machine learning model 192 in any technically feasible fashion. In some embodiments, the training application 190 repeatedly saves the current machine learning model 498 as a new version of the trained machine learning model 192 whenever a trigger is activated. The trigger can be activated based on any number and/or types of criteria.

In some embodiments, the parameter set 140 specifies, without limitation, any number and type of parameter values associated with activating the trigger. Some examples of parameter values associated with activating the trigger include, without limitation, a time interval between activations, a total number of iteration datasets 178 acquired between activations, etc. For explanatory purposes only, at any given point in time, the most recent version of the trained machine learning model 192 is denoted herein as the trained machine learning model $192_q$, where q is an integer between 1 and Q, and Q can be any positive integer.

For explanatory purposes only, FIG. 4 depicts the operations that the training application 190 performs to train the current machine learning model 498 based on the iteration dataset 178(x) and any portion of the parameter set 140. As shown, in some embodiments, the parameter set 140 includes, without limitation, the fine grid size 142, the grid ratio 144, the fine block size 146, a fine step size 446, and any number and/or types of other parameter values (indicated via an ellipsis) that are organized in any technically feasible fashion. As described previously herein in conjunction with FIG. 1, x is an integer that can denote any of the topology optimization iterations that are performed by the fine grid engine 160.

As shown, the iteration dataset 178(x) includes, without limitation the shape 128(x), the fine analysis result 166(x), and the shape 128(x+1). As described previously herein in conjunction with FIG. 1, the shape 128(x+1) is a modified version of the shape 128(x) that is generated by the shape optimizer 168 based on the fine analysis result 166(x). In some embodiments, the shape 128(x+1) is topologically optimized with respect to the shape 128(x) as per one or more design objectives.

As described previously herein in conjunction with FIG. 2, in some embodiments, the shape 128(x+1) and the shape 128(x) include, without limitation, the same total number of the fine shape elements 212. In the same or other embodiments, the fine analysis result 166(x) includes, without limitation, any amount and/or types of structural analysis data for each of the fine shape elements 212 included in the shape 128(x). In the context of the iteration dataset 178(x), and for explanatory purposes only, the shape 128(x), the shape 128(x+1), and the fine analysis result 166(x) are also referred to herein as the "input shape," "the structural analysis result," and the "output shape," respectively.

The training application 190 can acquire the iteration dataset 178(x) in any technically feasible fashion. In some embodiments, the training application 190 receives the iteration dataset 178(x) in real time from the fine grid engine 160. In some other embodiments, the training application 190 reads the iteration dataset 178(x) from any memory that is accessible to both the fine grid engine 160 and the training application 190.

As shown, in some embodiments, the data converter 420 includes, without limitation, a remesh engine 172'(1), a remesh engine 172'(2), and a normalization engine 242'. The remesh engine 172'(1) and the remesh engine 172'(2) are two different instances of the remesh engine 172 described previously herein in conjunction with FIG. 1. The normalization engine 242' is a different instance of the normalization engine 242 described previous herein in conjunction with FIG. 2.

As shown, in some embodiments, the data converter 420 inputs the shape 128(x) and the grid ratio 144 into the remesh engine 172'(1). In response, the remesh engine 172'(1) generates the coarse shape 174(x). The coarse shape 174(x) is a downsampled version of the shape 128(x), is associated with the coarse grid 220, and can be represented in any technically feasible fashion. In some embodiments, the coarse shape 174(x) includes, without limitation, a total number of the coarse shape elements 222 that is determined by the total number of fine shape elements 212 included in the shape 128(x) and the grid ratio 144.

In the same or other embodiments, the data converter 420 inputs the fine analysis result 166(x) and the grid ratio 144 into the remesh engine 172'(2). In response, the remesh engine 172'(2) generates the coarse analysis result 176(x). The coarse analysis result 176(x) is a downsampled version of the fine analysis result 166(x), is associated with the coarse grid 220, and can be represented in any technically feasible fashion. In some embodiments, the coarse analysis result 176(x) includes, without limitation, any amount and/or types of structural analysis data for each of the coarse shape elements 222 included in the coarse shape 174(x).

In some embodiments, the data converter 420 inputs the coarse analysis result 176(x) into the normalization engine 242'. In response, the normalization engine 242' generates a normalized coarse analysis result 246'. The functionality of the normalization engine 242' with respect to the coarse analysis result 176(x) is the same as the functionality of the normalization engine 242 with respect to the coarse analysis result 176(y) described in detail previously herein in conjunction with FIG. 2. The normalized coarse analysis result 246' can include, without limitation, any amount and/or types of normalized structural analysis data, any amount and/or types of structural analysis data that is not normalized, or any combination thereof for each of the coarse shape elements 222 included in the coarse shape 174(x).

As shown, in some embodiments, the data converter 420 generates potential training data 450 based on the shape 128(x), the shape 128(x+1), the coarse shape 174(x), the normalized coarse analysis result 246', and any portion of the parameter set 140. The potential training data 450 includes, without limitation, training sets 452(1)-452(T), where T is an integer that symbolizes a training block count 422. For explanatory purposes only, the training sets 452(1)-452(T) are also referred to herein collectively as "the training sets 452" and "the potential training sets." The training sets 452(1)-452(T) are also referred to herein individually as "the training set 452" and the "potential training set." The training block count 422 specifies a total number of training blocks (not shown) and can be equal to any positive integer.

In some embodiments, each of the training blocks defines a different portion of the 3D space associated with both the fine grid 210 and the coarse grid 220. In the same or other embodiments, any number of the training blocks can partially overlap with any number of the other training blocks. The data converter 420 can define the training blocks and the training block count 422 in any technically feasible fashion.

In some embodiments, the data converter 420 defines the training blocks based on a sliding window algorithm, the fine grid size 142, the fine block size 146, and the fine step size 446. The fine grid size 142 and the fine block size 146 are described in detail previously herein in conjunction with FIGS. 1 and 2. The fine step size 446 specifies a different step size in each of three dimensions relative to the voxels in the fine grid 210. In some embodiments, the data converter 420 defines the training blocks as the portions of 3D space delineated by a sliding window while scanning the entire 3D space associated with the fine grid 210 while moving one step in one of the three dimensions at a time. The sliding window has the dimensions of the fine block size 146 with respect to the fine grid 210 and the size of each step is defined by the fine step size 446. In the same or other embodiments, the data converter 420 sets the training block count 422 equal to the total number of the training blocks.

As shown, in some embodiments, the training set 452(1) includes, without limitation, a fine input block 252'(1), a coarse block 254'(1), a coarse result block 248'(1), and a fine output block 260'(1). Although not shown, the training sets 452(2)-452(T) include, without limitation, fine input blocks 252'(2)-252'(T), coarse blocks 254'(2)-254'(T), coarse result blocks 248'(2)-248'(T), and fine output blocks 260'(2)-260'(T). In some embodiments, each of the training sets 452 corresponds to a different training block. The data converter 420 can generate the training sets 452 in any technically feasible fashion.

In some embodiments, the data converter 420 initializes the training sets 452 to empty sets. Subsequently the data converter 420 applies the sliding window algorithm to the shape 128(x) based on the fine block size 146 and the fine step size 446 to generate the fine input blocks 252'(1)-252'(T). Accordingly, each of the fine input blocks 252'(1)-252'(T) includes, without limitation, a different subset of the fine shape elements 212 included in the shape 128(x), where any number of the subsets can partially overlap. The data converter 420 then adds the fine input blocks 252'(1)-252'(T) to the training sets 452(1)-452(T), respectively.

In the same or other embodiments, the data converter 420 applies the sliding window algorithm to the shape 128($x$+1) based on the fine block size 146 and the fine step size 446 to generate the fine output blocks 260'(1)-260'(T). Accordingly, each of the fine output blocks 260'(1)-260'(T) includes, without limitation, a different subset of the fine shape elements 212 included in the shape 128($x$+1), where any number of the subsets can partially overlap. The data converter 420 then adds the fine output blocks 260'(1)-260'(T) to the training sets 452(1)-452(T), respectively.

In some embodiments, the data converter 420 computes a coarse block size (not shown) and a coarse step size (not shown) based on the grid ratio 144, the fine block size 146, and the fine step size 446. The coarse block size specifies the 3D dimensions of each of the training blocks with respect to the coarse voxels in the coarse grid 220. The coarse step size specifies a different step size in each of three dimensions relative to the coarse voxels in the coarse grid 220.

In the same or other embodiments, the data converter 420 applies the sliding window algorithm to the coarse shape 174($x$) based on the coarse block size and the coarse step size to generate the coarse blocks 254'(1)-254'(T). Accordingly, each of the coarse blocks 254'(1)-254'(T) includes, without limitation, a different subset of the coarse shape elements 222 included in the coarse shape 174($y$), where any number of the subsets can partially overlap. The data converter 420 then adds the coarse blocks 254'(1)-254'(T) to the training sets 452(1)-452(T), respectively.

In some embodiments, the data converter 420 applies the sliding window algorithm to the normalized coarse analysis result 246' based on the coarse block size and the coarse step size to generate the coarse result blocks 248'(1)-248'(T). In some other embodiments, the data converter 420 omits the normalization engine 242', and the data converter 420 applies the sliding window algorithm to the coarse analysis result 176($x$) based on the coarse block size and the coarse step size to generate the coarse result blocks 248'(1)-248'(T). Each of the coarse result blocks 248'(1)-248'(T) includes, without limitation, any amount and/or types of structural analysis data for each of the coarse shape elements 222 included in the coarse blocks 254'(1)-254'(T), respectively. The data converter 420 then adds the coarse result blocks 248'(1)-248'(T) to the training sets 452(1)-452(T), respectively.

For explanatory purposes only, exemplary values for the fine grid size 142, the grid ratio 144, the fine block size 146, the fine step size 446, and the training block count 422 are depicted in italics. As shown, in some embodiments, the fine grid size 142 specifies that the dimensions of the fine grid 210 are 8×16×8, the grid ratio 144 specifies that the ratio between the fine grid 210 and the coarse grid 220 is 2:1, the fine block size 146 is 4×4×4, and the fine step size 446 is 2×2×2.

Based on the fine grid size 142 of 8×16×8, the shape 128($x$) and the shape 128($x$+1) each includes, without limitation, 1024 of the fine shape elements 212. Based on the fine grid size 142 and the grid ratio 144 of 2:1, the coarse shape 174($x$) includes, without limitation, 128 of the coarse shape elements 222. And the coarse analysis result 176($y$) includes, without limitation, any amount and/or type of structural analysis data for each of the 128 coarse shape elements 222 included in the coarse shape 174($x$).

As persons skilled in the art will recognize, applying the sliding window algorithm to the fine grid 210 based on the fine block size 146 of 4×4×4 and the fine step size 446 of 2×2×2 defines 63 different training blocks. In some embodiments, to generate the training sets 452(1)-452(63) (not explicitly shown), the data converter 420 applies a 4×4×4 sliding window to the shape 128($x$) and the shape 128($x$+1) based on steps of two of the fine shape elements 212 in each dimension to generate the fine input blocks 252'(1)-252'(63) and the fine output blocks 260'(1)-260'(63), respectively.

In the same or other embodiments, the data converter 420 computes the coarse block size of 2×2×2 based on the grid ratio 144 of 2:1 and the fine block size 146 of 4×4×4. The data converter 420 also computes the coarse step size of 1×1×1 based on the grid ratio 144 of 2:1 and the fine step size 446 of 1×1×1. Accordingly, the data converter 420 applies a 2×2×2 sliding window to the coarse shape 174($x$) and the normalized coarse analysis results 246' based on steps of one of the coarse shape elements 222 in each dimension to generate the coarse blocks 254'(1)-254'(63) and the coarse result blocks 248'(1)-248'(63), respectively.

As shown, in some embodiments, the data converter 420 inputs the potential training data 450 into the data filtering engine 460. In response, the data filtering engine 460 filters out any number of the training sets 452 included in the potential training data 450 to generate filtered training data 462. The data filtering engine 460 can determine which of the training sets 452 to filter out in any technically feasible fashion. In some embodiments, the data filtering engine 460 performs any number and/or types of filtering operations and/or any number and/or types of sampling operations on the training sets 452 included in the potential training data 450 to generate the filtered training data 462.

In some embodiments, the data filtering engine 460 preferentially retains (La, adds to the filtered training data 462) the training sets 452 that are associated with portions of the coarse shape 174($x$) that are closest to the boundary of the coarse shape 174($x$). As person skilled in the art will recognize, preferentially retaining the training sets 452 that are associated with portions of the coarse shape 174($x$) that are closest to the boundary of the coarse shape 174($x$) can increase the efficiency with which the training application 190 trains the current machine learning model 498. The data filtering engine 460 can determine distances of portions of the coarse shape 174($x$) to the boundary (or surface) of the coarse shape 174($x$) in any technically feasible fashion (e.g., via signed distance fields).

More precisely, in some embodiments, the data filtering engine 460 categorizes the training sets 452(1)-452(T) based on whether the coarse blocks 254'(1)-254'(T), respectively, represent portions of the coarse shape 174($x$) that are on the boundary of the coarse shape 174($x$), inside the coarse shape 174($x$), or outside the coarse shape 174($x$). For the subset of the training sets 452 that are associated with the "boundary" category, the data filtering engine 460 performs sampling operations that retain a relatively high percentage (e.g., 60%) of the training sets 452 and discard the remaining training sets 452.

In some embodiments, for the subset of the training sets 452 that are associated with the "outside" category, the data filtering engine 460 performs weighted sampling operations that retain a relatively low percentage (e.g., 15%) of the training sets 452. For each of the training sets 452 included in the outside category, the data filtering engine 460 computes the associated sampling weight based on the proximity of the portion of the coarse shape 174($x$) represented by the coarse block 254' included in the training set 452 to the boundary of the coarse shape 174($x$). In this fashion, with respect to the training sets 452 included in the outside category, the data filtering engine 460 preferentially retains the training sets 452 that are associated with portions of the coarse shape 174(x) that are closer to the surface of the coarse shape 174(x).

In the same or other embodiments, for the subset of the training sets 452 that are associated with the "inside" category, the data filtering engine 460 performs weighted sampling operations that retain a relatively low percentage (e.g., 25%) of the training sets 452. For each of the training sets 452 included in the inside category, the data filtering engine 460 computes the associated sampling weight based on the proximity of the portion of the coarse shape 174(x) represented by the coarse block 254' included in the training set 452 to the boundary of the coarse shape 174(x). In this fashion, with respect to the training sets 452 associated with the inside category, the data filtering engine 460 preferentially retains the training sets 452 that are associated with portions of the coarse shape 174(x) that are closer to the surface of the coarse shape 174(x).

As shown, in some embodiments, the training application 190 inputs the filtered training data 462 into the variation engine 470. In response, the variation engine 470 generates a training dataset 480 that includes, without limitation, the training sets 452 included in the filtered training data 462 and any number of new instances of the training set 452. The variation engine 470 can generate the new instances of the training set 452 in any technically feasible fashion based on any number of the training sets 452 included in the filtered training data 462.

Importantly, in some embodiments, the variation engine 470 performs any number and/or type of data augmentation operations on the filtered training data 462 that increase variations across the training dataset 480. As persons skilled in the art will recognize, increasing the variations across the training dataset 480 can increase the ability of the trained machine learning model 192 to generalize. The variation engine 470 can perform any number and/or types of data augmentation operations on the filtered training data 462 in any technically feasible fashion.

In some embodiments, for each of the training sets 452 included in the filtered training data 462, the variation engine 470 generates a rotated version of the training set 452. The rotated version of each of the training sets 452 is associated with a randomly rotated version of the training block corresponding to the training set 452. To generate the rotated version of the training set 452(i), where i can be any integer between 1 and T, the variation engine 470 randomly selects a 3D rotation direction. The variation engine 470 rotates each of the fine input block 252'(i), the fine output block 260'(i), the coarse block 254'(i), and the coarse result block 248'(i) based on the 3D rotation direction to generate a fine input block 252'(j), a fine output block 260'(j), a coarse block 254'(j), and a coarse result block 248'(j), where j can be any integer greater than T. Although not shown, the fine input block 252'(j), the fine output block 260'(j), the coarse block 254'(j), and the coarse result block 248'(j) are aligned and correspond to a new training block that does not correspond to the coarse shape 174(x).

The variation engine 470 generates a training set 452(j) that includes, without limitation, the fine input block 252'(j), the fine output block 260'(j), the coarse block 254'(j), and the coarse result block 248'(j). The variation engine 470 then adds the training set 452(i) and the training set 452(j) to the training dataset 480. In some other embodiments, the variation engine 470 can generate any number of variations of any number of the training sets 452 included in the filtered training data 462 in any technically feasible fashion. In the same or other embodiments, the variation engine 470 can generate the training dataset 480 based on the filtered training data 462 in any technically feasible fashion.

As shown, in some embodiments, the training engine 490 performs any number and/or types of machine learning operations on the current machine learning model 498 based on the training dataset 480. In some embodiments, for each of the training sets 452 included in the training dataset 480, the training engine 490 incrementally trains the current machine learning model 498 to map the coarse block 254', the coarse result block 248', and the fine input block 252' to the fine output block 260'. As described previously herein in conjunction with FIG. 1, in some embodiments, the fine grid engine 160 generates the shape 128(x+1) that includes the fine output block 260'. Accordingly, the training engine 490 incrementally teaches the current machine learning model 498 to predict the fine output blocks 260' that are included in the shape 128(x+1) based on the fine input blocks 252' included in the shape 128(x), the coarse blocks 254', and the coarse result blocks 248'.

In some other embodiments, each of the training sets 452 can include, without limitation, any amount and type of data that enables the training engine 490 to train the current machine learning model 498 to predict the fine output blocks 260'. For instance, in some other embodiments, each of the training sets 452 omits the fine input block 252', and the training engine 490 incrementally trains the current machine learning model 498 to map the coarse block 254' and the coarse result block 248' to the fine output block 260'. In yet other embodiments, each of the training sets 452 omits the coarse block 254', and the training engine 490 incrementally trains the current machine learning model 498 to map the fine input block 252' and the coarse result block 248' to the fine output block 260'.

As depicted with dashed arrows, in some embodiments, the training application 190 repeatedly saves a copy of the current machine learning model 498 as a new version of the trained machine learning model, denoted as the training machine learning model $192_q$, based on any amount and/or type of criteria (e.g., a activation of a trigger). In some embodiments, after generating the trained machine learning model $192_q$, the training application 190 stores the trained machine learning model $192_q$ in any memory that is accessible to the topology optimization application 120. In the same or other embodiments, the training application 190 transmits the trained machine learning model $192_q$ to any number and/or types of software applications (e.g., the topology optimization application 120 and/or the coarse grid engine 170) in any technically feasible fashion.

Figure 5:
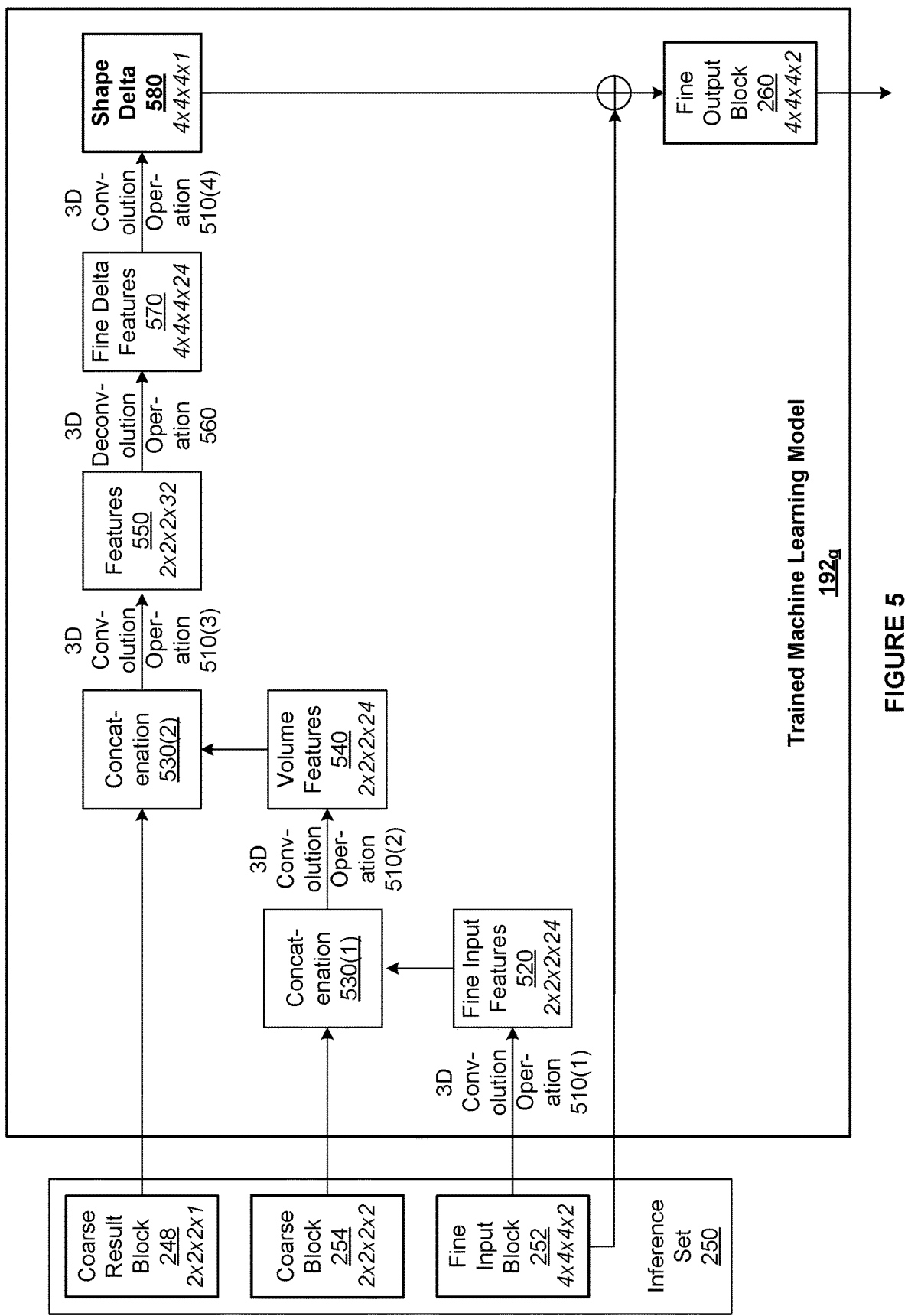
FIG. 5 is a more detailed illustration of the trained machine learning model of FIG. 1, according to various embodiments.

FIG. 5 is a more detailed illustration of the trained machine learning model $192_q$ of FIG. 1, according to various embodiments. In the embodiment depicted in FIG. 5, the trained machine learning model $192_q$ is a trained neural network having an exemplary architecture. As described previously herein in conjunction with FIG. 4, the current machine learning model 498 is the same type of model as each of the trained machine learning models 192, including the trained machine learning model $192_q$. Furthermore, the current machine learning model 498 and each of the trained machine learning models 192, including the trained machine learning model $192_q$, share the same architecture.

In some embodiments, including the embodiment depicted in FIG. 5, the trained machine learning model $192_q$ has an architecture that is similar to architectures that are often associated with a type of neural network commonly referred to as a 3D autoencoder. In some other embodiments, the trained machine learning model $192_q$ can be a trained version of a neutral network that has a different type of architecture. In yet other embodiments, the trained machine learning model $192_q$ can be a trained version of a different type of machine learning model or a trained composite machine learning model that includes trained versions of any number and/or types of machine learning models.

Although not shown, the current machine learning model 498 and each of the trained machine learning models 192 share the same total number of parameters (e.g., weights and/or biases). As persons skilled in the art will recognize, as the training engine 490 (not shown in FIG. 5) performs machine learning operations on the current machine learning models 498, the current machine learning model 498 learns the values of the parameters. The values of any number of the parameters can therefore vary between the trained machine learning models 192.

In some embodiments, the inputs to the trained machine learning model $192_q$ are included in the inference set 250. As described previously herein in conjunction with FIG. 2, in some embodiments, the inference set 250 includes, without limitation, the fine input block 252, the coarse block 254, and the coarse result block 248 corresponding to one of the inference blocks.

As shown, in some embodiments, the trained machine learning model $192_q$ performs a 3D convolution operation 510(1) on the fine input block 252. The 3D convolution operation 510(1) compresses the fine input block 252 to generate fine input features 520. The trained machine learning model $192_q$ then combines the fine input features 520 and the coarse block 254 to generate a concatenation 530(1). Subsequently, the trained machine learning model $192_q$ performs a 3D convolution operation 510(2) on the concatenation 530(1). The 3D convolution operation 510(2) compresses the concatenation 530(1) to generate volume features 540. In some embodiments, the volume features 540 are associated with a prediction of a finer version of the coarse block 254.

The trained machine learning model $192_q$ then combines the volume features 540 and the coarse result block 248 to generate a concatenation 530(2). Subsequently, the trained machine learning model $192_q$ performs a 3D convolution operation 510(3) on the concatenation 530(2). The 3D convolution operation 510(3) compresses the concatenation 530(2) to generate features 550. In some embodiments, the features 550 are associated with a prediction of how to topologically optimize the prediction of the finer version of the coarse block 254.

As shown, the trained machine learning model $192_q$ performs a 3D deconvolution operation 560 on the features 550. The 3D deconvolution operation 560 upsamples the features 550 to generate fine delta features 570. In some embodiments, the fine delta features 570 are associated with a prediction of how to topologically optimize the fine input block 252. Subsequently, the trained machine learning model $192_q$ performs a 3D convolution operation 510(4) on the fine delta features 570. The 3D convolution operation 510(4) compresses the fine delta features 570 to generate a shape delta 580. In some embodiments, the shape delta 580 is associated with any number and/or types of spatial modifications to the fine input block 252 that are predicted to topologically optimize the fine input block 252 as per one or more design objectives.

The trained machine learning model $192_q$ then performs any number of addition operations between the shape delta 580 and the fine input block 252 to generate the fine output block 260. In some embodiments, the fine output block 260 is predicted to be more convergent with one or more design objectives than the fine input block 252. In the same or other embodiments, the fine output block 260 is a modified version of the fine input block 252 that is predicted to be topologically optimized with respect to the fine input block 252 as per one or more design objectives. As shown, the trained machine learning model $192_q$ outputs the fine output block 260.

For explanatory purposes only, some exemplary dimensions for an exemplary embodiment are depicted in italics. Further, the dimensions of various instances of various objects are specified with respect to four dimensions, where the product of the four dimensions for a given instance is equal to the total number of discrete values associated with the instance.

In the exemplary embodiment, the fine input block 252 is a 4×4×4 block of the fine shape elements 212 described previously herein in conjunction with FIG. 2. Although not shown, each of the fine shape elements 212 includes, without limitation, a signed distance field and a keep-in label. Consequently, the dimensions of the fine input block 252 with respect to the four dimensions are 4×4×4×2.

In the exemplary embodiments, the coarse block 254 is a 2×2×2 block of the coarse shape elements 222 described previously herein in conjunction with FIG. 2. Although not shown, each of the coarse shape elements 222 includes, without limitation, a signed distance field and a keep-in label. Consequently, the dimensions of the coarse block 254 with respect to the four dimensions are 2×2×2×2.

Although not shown, in the exemplary embodiment, the coarse result block 248 is a 2×2×2 block of strain energy values, where each strain energy value corresponds to a different one of the coarse shape elements 222 included in the coarse block 254. Consequently, the dimensions of the coarse result block 248 with respect to the four dimensions are 2×2×2×1.

In the exemplary embodiment the trained machine learning model $192_q$ performs the 3D convolution operation 510(1) on the fine input block 252 to generate the fine input features 520 having the dimensions of 2×2×2×24. After combining the fine input features 520 and the coarse block 254 to generate the concatenation 530(1), the trained machine learning model $192_q$ performs the 3D convolution operation 510(2) on the concatenation 530(1) to generate the volume features 540 having the dimensions of 2×2×2×24. After combining the volume features 540 and the coarse result block 248 to generate the concatenation 530(2), the trained machine learning model $192_q$ performs the 3D convolution operation 510(3) on the concatenation 530(2) to generate the features 550 having the dimensions of 2×2×2×32.

Subsequently, the trained machine learning model $192_q$ performs the 3D deconvolution operation 560 on the features 550 to generate the fine delta features 570 having the dimensions of 4×4×4×24. The trained machine learning model $192_q$ performs the 3D convolution operation 510(4) on the fine delta features 570 to generate the shape delta 580 having the dimensions of 4×4×4×1. In some embodiments, the shape delta 580 includes, without limitation, a different signed distance field delta for each of the signed distance fields included in the fine input block 252. The trained machine learning model $192_q$ then performs any number of addition operations between the shape delta 580 and the fine input block 252 to generate the fine output block 260.

In the exemplary embodiment, the fine output block 260 is a 4×4×4 block of the fine shape elements 212, where each of the fine shape elements 212 includes, without limitation, a signed distance field and a keep-in label. Consequently, the dimensions of the fine output block 260 with respect to the 4D space are 4×4×4×2. In some other embodiments, the fine output block 260 can be replaced with an SDF output block. The SDF output block includes, without limitation, a different signed distance field for each of the fine shape elements 212 included in the fine input block 252. Consequently, if the dimensions of the fine input block 252 were 4×4×4×4, then the dimensions of the SDF block would be 4×4×4×1. In some such embodiments, the inference engine 180 generates the fine output block 260 based on the SDF output block and the keep-in labels included in the fine input block 252.

Figure 6:
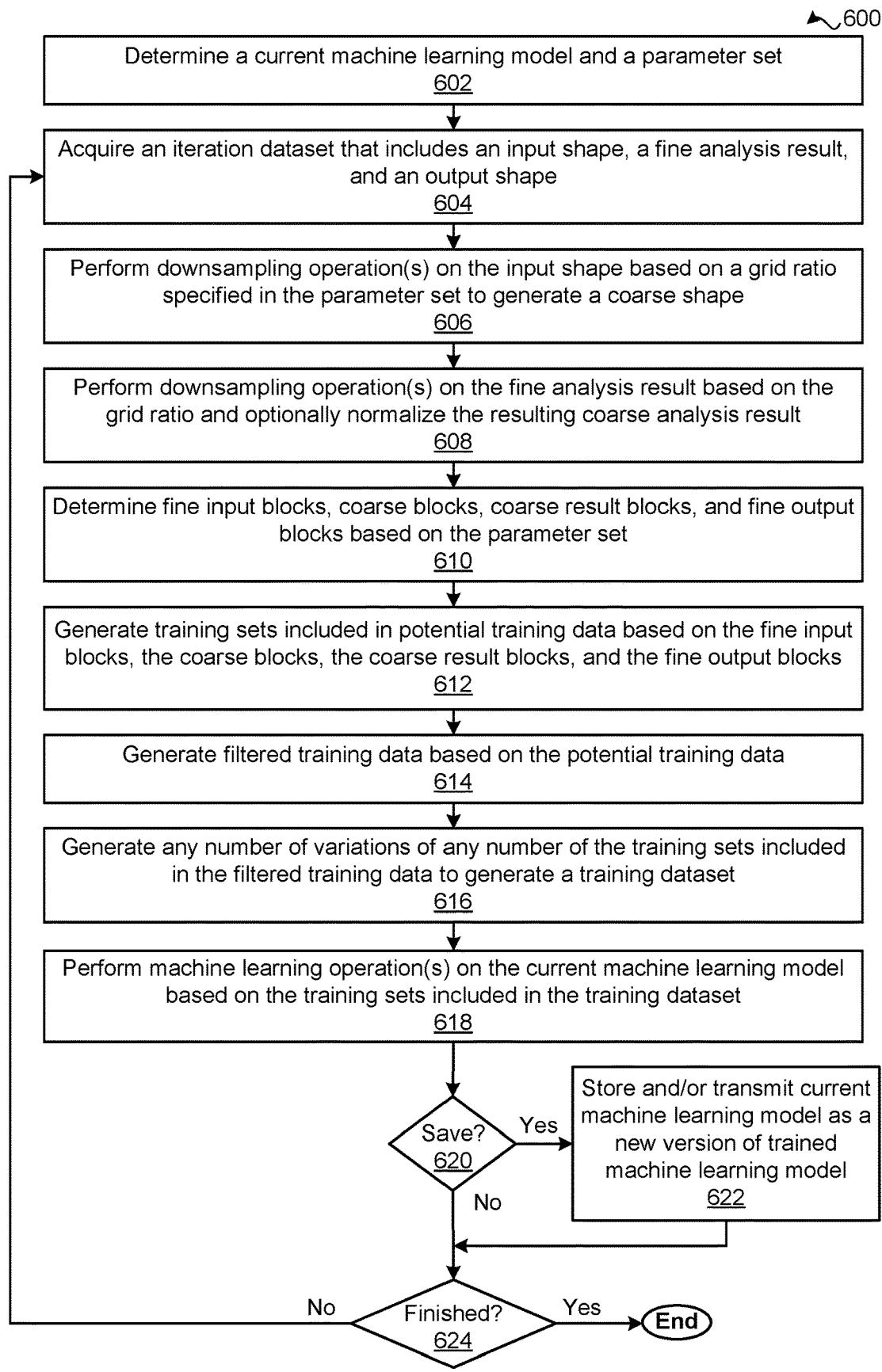
FIG. 6 is a flow diagram of method steps for training a machine learning model to modify portions of shapes when designing 3D objects, according to various embodiments.

FIG. 6 is a flow diagram of method steps for training a machine learning model to modify portions of shapes when designing 3D objects, according to various embodiments. Although the method steps are described with reference to the systems of FIGS. 1, 2, 4, and 5, persons skilled in the art will understand that any system configured to implement the method steps, in any order, falls within the scope of the present invention.

As shown, a method 600 begins a step 602, where the training application 190 determines the current machine learning model 498 and the parameter set 140. At step 604, the training application 190 acquires the iteration dataset 178 that includes, without limitation, the input shape, the fine analysis result 166 associated with the input shape, and the output shape. For instance, and as described previously herein in conjunction with FIG. 4, tin some embodiments, the training application 190 acquires the iteration dataset 178($x$) that includes, without limitation, the shape 128($x$), the fine analysis result 166($x$), and the shape 128($x$+1).

At step 606, the data converter 420 performs any number and/or types of downsampling operations on the input shape based on the grid ratio 144 specified in the parameter set 140 to generate the coarse shape 174. At step 608, the data converter 420 performs any number and/or types of downsampling operations on the fine analysis result 166 based on the grid ratio 144 specified in the parameter set 140 to generate the coarse analysis result 176. As part of step 608, in some embodiments, the data converter 420 performs any number and/or type of normalization operations on the coarse analysis result 176 to generate the normalized coarse analysis result 246'.

At step 610, the training application 190 determines the fine input blocks 252', the coarse blocks 254', the coarse result blocks 248', and the fine output blocks 260' based on the input shape, the coarse shape 174, the coarse analysis result 176 (or the normalized coarse analysis result 246'), and the output shape, respectively, and the parameter set 140. At step 612, the training application 190 generates training sets 452 included in the potential training data 450 based on the fine input blocks 252', the coarse blocks 254', the coarse result blocks 248', and the fine output blocks 260'.

At step 614, the data filtering engine 460 generates the filtered training data 462 based on the potential training data 450. At step 616, the variation engine 470 generates any number of variations of any number of the training sets 452 included in the filtered training data 462 to generate the training dataset 480. At step 618, the training engine 490 performs any number and/or types of machine learning operations on the current machine learning model 498 based on the training sets 452 included in the training dataset 480.

At step 620, the training application 190 determines whether to save the current machine learning model 498. The training application 190 can determine whether to save the current machine learning model 498 in any technically feasible fashion based on any amount and/or type of data. If, at step 620, the training application determines not to save the current machine learning model 498, then the method 600 proceeds directly to step 624.

If, however, at step 620, the training application 190 determines to save the current machine learning model 498, then the method 600 proceeds to step 622. At step 622, the training application 190 saves a copy of the current machine learning model 498 and/or transmits a copy of the current machine learning model 498 as a new version of the trained machine learning model 192.

At step 624, the training application 190 determines whether the training application 190 has finished training the current machine learning model 498. The training application 190 can determine whether the training application 190 has finished training the current machine learning model 498 in any technically feasible fashion. In some embodiments, the training application 190 determines whether the training application 190 has finished training the current machine learning model 498 based on whether the training application 190 has detected any new instances of the iteration dataset 178. If, at step 624, the training application 190 determines that the training application 190 has finished training the current machine learning model 498, then the method 600 terminates.

If, however, at step 624, the training application 190 determines that the training application 190 has not finished training the current machine learning model 498, then the method 600 returns to step 604, where the training application 190 acquires a new instance of the iteration dataset 178. The method 600 continues to cycle though steps 604-624 until, at step 624, the training application 190 determines that the training application 190 has finished training the current machine learning model 498. The method 600 then terminates.

In sum, the disclosed techniques can be used to efficiently solve topology optimization problems associated with the generative design of 3D objects. In some embodiments, a generative design application configures a topology optimization application to solve a topology optimization problem associated with a 3D object. The topology optimization application implements a fine grid that is associated with a resolution at which a shape representing the 3D object is to be optimized and a coarse grid that is a downsampled version of the fine grid. The topology optimization application generates an initial version of the shape that includes, without limitation, a different fine shape element for each voxel in the fine grid. The topology optimization application iteratively modifies the shape during alternating fine grid phases and coarse grid phases that each include any number of topology optimization iterations to solve the topology optimization problem.

During an $x^{th}$ topology optimization iteration, where x denotes any topology optimization iteration during the fine grid phase, the topology optimization application configures a fine grid engine to modify an $x^{th}$ shape (i.e., an $x^{th}$ version of the shape) to generate an $(x+1)^{th}$ shape that is a topology optimized version of the $x^{th}$ shape as per one or more design objectives. In operation, the fine grid engine configures a structural analyzer to generate a fine analysis result based on the $x^{th}$ shape. The fine analysis result includes a different strain energy value for each of the fine shape elements included in the $x^{th}$ shape. Subsequently, the fine grid engine configures a shape optimizer to perform any number and/or types of topology optimization operations on the $x^{th}$ shape based on the fine analysis result to generate the $(x+1)^{th}$ shape. The fine grid engine then generates an iteration dataset that includes, without limitation, the $x^{th}$ shape, the fine analysis result, and the $(x+1)^{th}$ shape. The fine grid engine provides the iteration dataset to a training application.

In some embodiments, the training application executes at least partially in parallel with the fine grid engine. Initially, the training application sets a current machine learning model equal to an untrained machine learning model. Subsequently, the training application incrementally trains the current machine learning model based on the iteration datasets received from the fine grid engine. In some embodiments, upon acquiring the iteration dataset associated with the $x^{th}$ topology optimization iteration, the training application generates a coarse shape and a coarse analysis result based on the $x^{th}$ shape and the fine analysis result, respectively. The coarse shape and the coarse analysis result are downsampled versions of the $x^{th}$ shape and the fine analysis result, respectively, and correspond to the coarse grid. The training application then performs any number and/or types of normalization operations on the coarse analysis result to generate a normalized coarse analysis result.

The training application generates a different training set for each of any number of training blocks based on the $x^{th}$ shape, the coarse shape, the coarse analysis result, and the $(x+1)^{th}$ shape. Each of the training blocks is associated with a different non-overlapping portion of the 3D space associated with both the fine grid and the coarse grid. In some embodiments, to determine the training blocks, the training application applies a sliding window algorithm to each of the fine input shape, the coarse shape, the normalized coarse result, and the fine output shape. Each of the training sets incudes, without limitation, a fine input block, a coarse block, a coarse result block, and a fine output block that correspond to the associated training block.

The training application then performs any number and/or types of filtering operations and/or any number and/or types of rotation operations on the training sets to generate a training dataset that includes any number of the training sets and any number of variations of the training sets. The training application performs any number of machine learning operations on the current machine learning model based on the training dataset. The machine learning operations incrementally train the current machine learning model to map a coarse block, a normalized coarse result block, and a fine input block to a fine output block. The fine output block generated by the current machine learning model is a modified version of the fine input block that is predicted to be more convergent with one or more design objectives than the fine input block. The training application periodically saves the current machine learning model as a new version of a trained machine learning model.

The topology optimization application uses the coarse grid engine and the most recent version of the trained machine learning model to execute the coarse grid phases. During a $y^h$ topology optimization iteration, where y denotes any topology optimization iteration during the coarse grid phase, the topology optimization application configures the coarse grid engine to modify a $y^{th}$ shape (i.e., a $y^{th}$ version of the shape) to generate a $(y+1)^{th}$ shape that is predicted to be more convergent with one or more design objectives than the $y^{th}$ shape.

In operation, the coarse grid engine generates a coarse shape based on the $y^{th}$ shape, where the coarse shape is a downsampled version of the $y^{th}$ shape. In some embodiments, the coarse shape includes a different coarse shape element for each coarse voxel included in the coarse grid. The coarse grid engine configures a structural analyzer to generate a coarse analysis result based on the coarse shape.

The coarse analysis result includes a different strain energy for each of the coarse shape elements included in the coarse shape. Subsequently, an inference engine included in the coarse grid engine performs any number and/or types of normalization operations on the strain energy values included in the coarse analysis result to generate a normalized coarse analysis result. The inference engine then determine any number of non-overlapping inference blocks that, together, space the 3D space associated with the fine grid and the coarse grid. The inference engine partitions each of the $y^{th}$ shape, the coarse shape, and the normalized coarse analysis result into fine input blocks, coarse blocks, and coarse result blocks, respectively, based on the inference blocks.

For each of the inference blocks, the inference engine generates an inference set that includes the corresponding fine input block, the corresponding coarse block, and the corresponding coarse result block. The inference engine inputs each of the inference sets into most recent version of the trained machine learning model. In response, the trained machine learning model outputs fine output blocks. Each of the fine output blocks is a modified version of the associated fine input block and has the same resolution as the fine input block. The inference engine aggregates the fine input blocks to generate the $(y+1)^{th}$ shape.

After the topology optimization application determines that a completion criterion has been met, the topology optimization application saves the version of the shape generated during the last topology optimization iteration as an optimized shape. The optimized shape is a solution to the associated topology optimization problem. The topology optimization application then transmits the optimized shape to the generative design application.

At least one technical advantage of the disclosed techniques relative to the prior art is that, with the disclosed techniques, the topology optimization application can use the trained machine learning model to reduce the computational complexity associated with solving topology optimization problems. More specifically, because the coarse grid engine uses the trained machine learning model to optimize fine shape elements based on structural analysis results for coarse shape elements, the total number of structural analysis operations performed when solving a given topology optimization problem is reduced. Consequently, when the amounts of time and/or computational resources allocated for design activities are limited, a generative design application can use the topology optimization application to more comprehensively explore the overall design space relative to prior art approaches. The generative design application can therefore produce designs that are more convergent with the design objectives. These technical advantages provide one or more technological improvements over prior art approaches.

1. In some embodiments, a computer-implemented method for solving a topology optimization problem when designing a three-dimensional ("3D") object comprises converting a first shape having a first resolution and representing the 3D object to a coarse shape having a second resolution that is lower than the first resolution, computing coarse structural analysis data based on the coarse shape, and generating, via a trained machine learning model, a second shape having the first resolution and representing the 3D object based on the first shape and the coarse structural analysis data, wherein the trained machine learning model modifies a portion of a shape having the first resolution based on structural analysis data having the second resolution.

2. The computer-implemented method of clause 1, wherein the second shape is more convergent with a design objective associated with the topology optimization problem than the first shape.

3. The computer-implemented method of clauses 1 or 2, wherein converting the first shape to the coarse shape comprises performing one or more downsampling operations on the first shape.

4. The computer-implemented method of any of clauses 1-3, wherein the first shape comprises a 3D mesh of shape elements, and wherein each shape element is associated with a different voxel of a 3D grid having the first resolution.

5. The computer-implemented method of any of clauses 1-4, wherein each shape element includes at least one of a signed distance field or a keep-in label.

6. The computer-implemented method of any of clauses 1-5, wherein the coarse structural analysis data comprises at least one of a plurality of strain energy values, a plurality of displacements, or a plurality of rotations.

7. The computer-implemented method of any of clauses 1-6, wherein computing the coarse structural analysis data comprises performing one or more structural analysis operations on the coarse shape to generate non-normalized coarse structural analysis data, and performing one or more normalization operations on at least a portion of the non-normalized coarse structural analysis data to generate the coarse structural analysis data.

8. The computer-implemented method of any of clauses 1-7, wherein generating the second shape comprises performing one or more partitioning operations on the coarse structural analysis data and on at least one of the first shape or the coarse shape to generate a plurality of inference sets, inputting the inference sets into the trained machine learning model that, in response, outputs a plurality of modified portions of the first shape, and aggregating the plurality of modified portions of the first shape to generate the second shape.

9. The computer-implemented method of any of clauses 1-8, wherein the trained machine learning model comprises a trained neural network.

10. The computer-implemented method of any of clauses 1-9, wherein the 3D object is designed via a generative design process that involves the topology optimization problem, and the first shape is generated based on a specification for the topology optimization problem.

11. In some embodiments, one or more non-transitory computer readable media include instructions that, when executed by one or more processors, cause the one or more processors to solve a topology optimization problem when designing a three-dimensional ("3D") object by performing the steps of converting a first shape having a first resolution and representing the 3D object to a coarse shape having a second resolution that is lower than the first resolution, computing coarse structural analysis data based on the coarse shape, and generating, via a trained machine learning model, a second shape having the first resolution and representing the 3D object based on the first shape and the coarse structural analysis data, wherein the trained machine learning model modifies a portion of a shape having the first resolution based on structural analysis data having the second resolution.

12. The one or more non-transitory computer readable media of clause 11, wherein the second shape is more convergent with a design objective associated with the topology optimization problem than the first shape.

13. The one or more non-transitory computer readable media of clauses 11 or 12, wherein converting the first shape to the coarse shape comprising performing one or more field transfer operations or remeshing operations on the first shape.

14. The one or more non-transitory computer readable media of any of clauses 11-13, wherein the coarse shape comprises a 3D mesh of shape elements, and wherein each shape element is associated with a different voxel of a 3D grid having the second resolution.

15. The one or more non-transitory computer readable media of any of clauses 11-14, wherein the coarse structural analysis data comprises at least one of a plurality of strain energy values, a plurality of displacements, or a plurality of rotations.

16. The one or more non-transitory computer readable media of any of clauses 11-15, wherein computing the coarse structural analysis data comprises performing one or more structural analysis operations on the coarse shape to generate a plurality of strain energy values, and performing one or more normalization operations on the plurality of strain energy values to generate the coarse structural analysis data.

17. The one or more non-transitory computer readable media of any of clauses 11-16, wherein generating the second shape comprises performing one or more partitioning operations on the coarse structural analysis data and on at least one of the first shape or the coarse shape to generate a plurality of inference sets, inputting the plurality of inference sets into the trained machine learning model that, in response, outputs a plurality of modified portions of the first shape, and aggregating the plurality of modified portions of the first shape to generate the second shape.

18. The one or more non-transitory computer readable media of any of clauses 11-17, wherein generating the second shape comprises computing a first inference set associated with a first portion of the first shape based on the coarse structural analysis data and at least one of the first shape or the coarse shape, inputting the first inference set into the trained machine learning model that, in response, generates a modified first portion of the first shape, and aggregating the modified first portion of the first shape with at least a modified second portion of the first shape to generate the second shape.

19. The one or more non-transitory computer readable media of any of clauses 11-18, wherein the 3D object is designed via a generative design process that involves the topology optimization problem, and the first shape is generated based on a specification for the topology optimization problem.

20. In some embodiments, a system comprises one or more memories storing instructions and one or more processors coupled to the one or more memories that, when executing the instructions, perform the steps of converting a first shape having a first resolution and representing a three-dimensional ("3D") object to a coarse shape having a second resolution that is lower than the first resolution, computing coarse structural analysis data based on the coarse shape, and generating, via a trained machine learning model, a second shape having the first resolution and representing the 3D object based on the first shape and the coarse structural analysis data, wherein the trained machine learning model modifies a portion of a shape having the first resolution based on structural analysis data having the second resolution.

Any and all combinations of any of the claim elements recited in any of the claims and/or any elements described in this application, in any fashion, fall within the contemplated scope of the embodiments and protection.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments. Aspects of the present embodiments can be embodied as a system, method or computer program product. Accordingly, aspects of the present disclosure can take the form of an entirely hardware embodiment, an entirely software embodiment (including firmware, resident software, micro-code, etc.) or an embodiment combining software and hardware aspects that can all generally be referred to herein as a "module," a "system," or a "computer." In addition, any hardware and/or software technique, process, function, component, engine, module, or system described in the present disclosure can be implemented as a circuit or set of circuits. Furthermore, aspects of the present disclosure can take the form of a computer program product embodied in one or more computer readable media having computer readable program codec embodied thereon.

Any combination of one or more computer readable media can be utilized. Each computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory, a read-only memory, an erasable programmable read-only memory, a Flash memory, an optical fiber, a portable compact disc read-only memory, an optical storage device, a magnetic storage device, or any suitable combination of the foregoing. In the context of this document, a computer readable storage medium can be any tangible medium that can contain or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions can be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams can represent a module, segment, or portion of code, which comprises one or more executable instructions for implementing the specified logical function(s). It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure can be devised without departing from the basic scope thereof, and the scope thereof is determined by the claims that follow.

What is claimed is:

1. A computer-implemented method for solving a topology optimization problem when designing a three-dimensional ("3D") object, the method comprising:
converting a first shape having a first resolution and representing the 3D object to a coarse shape having a second resolution that is lower than the first resolution;
computing coarse structural analysis data based on the coarse shape; and
generating, via a trained machine learning model, a second shape having the first resolution and representing the 3D object based on the first shape and the coarse structural analysis data, wherein the trained machine learning model modifies a portion of a given shape having the first resolution based on structural analysis data having the second resolution.

2. The computer-implemented method of claim 1, wherein the second shape is more convergent with a design objective associated with the topology optimization problem than the first shape.

3. The computer-implemented method of claim 1, wherein converting the first shape to the coarse shape comprises performing one or more downsampling operations on the first shape.

4. The computer-implemented method of claim 1, wherein the first shape comprises a 3D mesh of shape elements, and wherein each shape element is associated with a different voxel of a 3D grid having the first resolution.

5. The computer-implemented method of claim 4, wherein each shape element includes at least one of a signed distance field or a keep-in label.

6. The computer-implemented method of claim 1, wherein the coarse structural analysis data comprises at least one of a plurality of strain energy values, a plurality of displacements, or a plurality of rotations.

7. The computer-implemented method of claim 1, wherein computing the coarse structural analysis data comprises:
performing one or more structural analysis operations on the coarse shape to generate non-normalized coarse structural analysis data; and
performing one or more normalization operations on at least a portion of the non-normalized coarse structural analysis data to generate the coarse structural analysis data.

8. The computer-implemented method of claim 1, wherein generating the second shape comprises:

performing one or more partitioning operations on the coarse structural analysis data and on at least one of the first shape or the coarse shape to generate a plurality of inference sets;

inputting the inference sets into the trained machine learning model that, in response, outputs a plurality of modified portions of the first shape; and aggregating the plurality of modified portions of the first shape to generate the second shape.

9. The computer-implemented method of claim 1, wherein the trained machine learning model comprises a trained neural network.

10. The computer-implemented method of claim 1, wherein the 3D object is designed via a generative design process that involves the topology optimization problem, and the first shape is generated based on a specification for the topology optimization problem.

11. One or more non-transitory computer readable media including instructions that, when executed by one or more processors, cause the one or more processors to solve a topology optimization problem when designing a three-dimensional ("3D") object by performing the steps of:

converting a first shape having a first resolution and representing the 3D object to a coarse shape having a second resolution that is lower than the first resolution;

computing coarse structural analysis data based on the coarse shape; and generating, via a trained machine learning model, a second shape having the first resolution and representing the 3D object based on the first shape and the coarse structural analysis data, wherein the trained machine learning model modifies a portion of a given shape having the first resolution based on structural analysis data having the second resolution.

12. The one or more non-transitory computer readable media of claim 11, wherein the second shape is more convergent with a design objective associated with the topology optimization problem than the first shape.

13. The one or more non-transitory computer readable media of claim 11, wherein converting the first shape to the coarse shape comprising performing one or more field transfer operations or remeshing operations on the first shape.

14. The one or more non-transitory computer readable media of claim 11, wherein the coarse shape comprises a 3D mesh of shape elements, and wherein each shape element is associated with a different voxel of a 3D grid having the second resolution.

15. The one or more non-transitory computer readable media of claim 11, wherein the coarse structural analysis data comprises at least one of a plurality of strain energy values, a plurality of displacements, or a plurality of rotations.

16. The one or more non-transitory computer readable media of claim 11, wherein computing the coarse structural analysis data comprises:

performing one or more structural analysis operations on the coarse shape to generate a plurality of strain energy values; and performing one or more normalization operations on the plurality of strain energy values to generate the coarse structural analysis data.

17. The one or more non-transitory computer readable media of claim 11, wherein generating the second shape comprises:

performing one or more partitioning operations on the coarse structural analysis data and on at least one of the first shape or the coarse shape to generate a plurality of inference sets;

inputting the plurality of inference sets into the trained machine learning model that, in response, outputs a plurality of modified portions of the first shape; and aggregating the plurality of modified portions of the first shape to generate the second shape.

18. The one or more non-transitory computer readable media of claim 11, wherein generating the second shape comprises:

computing a first inference set associated with a first portion of the first shape based on the coarse structural analysis data and at least one of the first shape or the coarse shape;

inputting the first inference set into the trained machine learning model that, in response, generates a modified first portion of the first shape; and aggregating the modified first portion of the first shape with at least a modified second portion of the first shape to generate the second shape.

19. The one or more non-transitory computer readable media of claim 11, wherein the 3D object is designed via a generative design process that involves the topology optimization problem, and the first shape is generated based on a specification for the topology optimization problem.

20. A system comprising:

one or more memories storing instructions; and one or more processors coupled to the one or more memories that, when executing the instructions, perform the steps of:

converting a first shape having a first resolution and representing a three-dimensional ("3D") object to a coarse shape having a second resolution that is lower than the first resolution;

computing coarse structural analysis data based on the coarse shape; and generating, via a trained machine learning model, a second shape having the first resolution and representing the 3D object based on the first shape and the coarse structural analysis data, wherein the trained machine learning model modifies a portion of a given shape having the first resolution based on structural analysis data having the second resolution.

\* \* \* \* \*